(12) United States Patent
Toyonaka et al.

(10) Patent No.: US 8,907,266 B2
(45) Date of Patent: Dec. 9, 2014

(54) LIGHT-RECEIVING DEVICE ARRAY, OPTICAL RECEIVER MODULE, AND OPTICAL TRANSCEIVER

(75) Inventors: Takashi Toyonaka, Kanagawa (JP); Takuma Ban, Kanagawa (JP); Hiroshi Hamada, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 394 days.

(21) Appl. No.: 13/465,260

(22) Filed: May 7, 2012

(65) Prior Publication Data
US 2012/0292731 A1 Nov. 22, 2012

(30) Foreign Application Priority Data

May 18, 2011 (JP) .................................. 2011-111196
Apr. 6, 2012 (JP) .................................. 2012-87431

(51) Int. Cl.
*H01J 5/02* (2006.01)
*H04B 10/00* (2013.01)
*H01L 31/0224* (2006.01)
*H01L 31/109* (2006.01)
*H01L 27/144* (2006.01)

(52) U.S. Cl.
CPC .................... *H01L 31/022408* (2013.01); *H01L 2224/48091* (2013.01); *H01L 31/109* (2013.01); *H01L 27/1446* (2013.01)
USPC ............................ 250/239; 398/202; 398/164

(58) Field of Classification Search
CPC ........................ H01L 27/1446; G02B 6/4201
USPC .................... 250/239; 398/202, 164; 257/448
See application file for complete search history.

(56) References Cited

U.S. PATENT DOCUMENTS 7,046,936 B2 * 5/2006 Aruga .......................... 398/202
7,062,178 B1 6/2006 Tagami et al.

FOREIGN PATENT DOCUMENTS

| JP | 2001-257335 A | 9/2001 |
| JP | 2003-243777 A | 8/2003 |
| JP | 2009-093131 A | 4/2009 |

* cited by examiner

*Primary Examiner* — Thanh Luu
(74) *Attorney, Agent, or Firm* — Mattingly & Malur, PC

(57) ABSTRACT

A light-receiving device array includes a photodiode array that is provided with plural light-receiving sections each of which includes a first conductivity type electrode and a second conductivity type electrode, and a carrier, wherein the carrier includes plural pair of electric lines each of which is formed from a first electric line connected to the first conductivity type electrode of each light-receiving section, and a second electric line connected to the second conductivity type electrode of the light-receiving section, a first ground electrode that extends between one pair of electric lines of the plural pair of electric lines and a pair of electric lines adjacent to the one pair of electric lines, and a second ground electrode that is formed on a part of the rear surface and is electrically connected to the first ground electrode.

18 Claims, 12 Drawing Sheets

LIGHT-RECEIVING DEVICE ARRAY, OPTICAL RECEIVER MODULE, AND OPTICAL TRANSCEIVER

CROSS REFERENCE TO RELATED APPLICATION

The present application claims priority from Japanese applications JP 2011-111196 filed on May 18, 2011, and JP 2012-87431 filed on Apr. 6, 2012, the content of which is hereby incorporated by reference into this application.

BACKGROUND OF THE INVENTION

1. Field of the Invention

The present invention relates to a light-receiving device array, and more particularly to reducing a crosstalk occurring via plural electric lines disposed in the light-receiving device array.

2. Description of the Related Art

In recent years, a light-receiving device array having plural photodiodes has been used. For example, a light-receiving device array having two photodiodes will be described below. FIG. 11A is a perspective view when a light-receiving device array 101 in the related art is viewed from the front surface side. The light-receiving device array 101 is a two-channel light-receiving device array which includes a photodiode array 103 having two light-receiving sections and a carrier 102 holding the photodiode array 103.

Each of the light-receiving sections of the photodiode array 103 has a first conductivity type electrode (for example, a P type electrode) and a second conductivity type electrode (for example, an N type electrode), and the first conductivity type electrode and the second conductivity type electrode are respectively connected to a first electric line and a second electric line disposed at the carrier 102. In the first electric line, a portion formed on the front surface of the carrier 102 is a front surface first electric line electrode 123, and a portion formed on the upper surface of the carrier 102 is an upper surface first electric line electrode 124. Similarly, in the second electric line, a portion formed on the front surface of the carrier 102 is a front surface second electric line electrode 126, and a portion formed on the upper surface of the carrier 102 is an upper surface second electric line electrode 127.

The carrier 102 is provided with two pairs of electric lines which are respectively connected to the two light-receiving sections of the photodiode array 103. On the front surface of the carrier 102, the front surface second electric line electrode 126a, the front surface first electric line electrode 123a, the front surface first electric line electrode 123b, and the front surface second electric line electrode 126b are formed in this order from the right of the figure.

FIG. 11B is a perspective view when the light-receiving device array 101 in related art is viewed from the rear surface side. A grounding electrode 134 is formed on a part of the rear surface of the carrier 102. FIG. 12 is a perspective view when main portions of an optical receiver module 105 in the related art are viewed from the front surface side. The optical receiver module 105 includes the light-receiving device array 101, a base 104, a preamplifier circuit 147, and reference voltage terminals 149a and 149b shown in FIG. 11A. Signal voltage terminals 148a and 148b of the preamplifier circuit 147 are connected to the first electric lines via pattern connection wires, and the reference voltage terminals 149a and 149b are connected to the second electric lines via pattern connection wires.

SUMMARY OF THE INVENTION

In the light-receiving device array having plural photodiodes according to the related art, electrical crosstalk occurs between the electric lines which are respectively connected to two adjacent photodiodes, that is, between the adjacent channels and the electrical crosstalk causes noise. Thereby, operation errors occur in an optical module and an optical transceiver including the light-receiving device array embedded therein. For example, in the light-receiving device array 101 shown in FIG. 11A, the first electric lines of the two light-receiving sections are adjacent to each other. Therefore, electrical crosstalk mainly occurs between the two first electric lines.

An example of the related art regarding an array type target point photodiode module for wavelength multiplex transmission, for example, as the light-receiving device array, is disclosed in JP 2009-93131A. The related art disclosed in JP 2009-93131 A provides a method of reducing crosstalk caused by light interference between adjacent channels; however, in the light-receiving device array, electrical crosstalk occurs between adjacent photodiodes and between electric lines connected to the photodiodes, the electrical crosstalk causes noise. Thereby operation errors occur in an optical module and an optical transceiver including the light-receiving device array embedded therein.

JP 2001-257335 A discloses a method of reducing electrical crosstalk between adjacent photodiodes. The related art disclosed in JP 2001-257335 A presents a method in which, in a photodiode array, a photodiode which is provided with means for receiving an optical signal and inputting the optical signal to a signal detection circuit and a dummy photodiode which makes a potential difference between electrodes constant are alternately arranged, thereby reducing crosstalk between the photodiodes.

Similarly, the related art disclosed in JP 2003-243777 A presents a method in which, in a semiconductor laser array, a shield portion is formed at a separation region between chips and is connected to a ground voltage, thereby reducing crosstalk between adjacent channels, and this technique can be applied to a photodiode array.

However, even in a case where the related art disclosed in JP 2001-257335 A and JP 2003-243777 A is applied to a photodiode array for reducing crosstalk between adjacent channels, electric lines for connecting the photodiode array to the preamplifier circuit are disposed in the light-receiving device array, and thus electrical crosstalk occurs between the adjacent electric lines, which causes noise, and thereby operation errors occur in an optical module and an optical transceiver including the light-receiving device array embedded therein.

The present invention has been made in consideration of these circumstances, and an object thereof is to provide a light-receiving device array capable of reducing crosstalk occurring via plural electric lines disposed in the light-receiving device array having plural light-receiving sections, an optical receiver module, and an optical transceiver.

(1) According to an aspect of the present invention, there is provided a light-receiving device array including a photodiode array that is provided with plural light-receiving sections on a semiconductor substrate, each of which includes a first conductivity type electrode and a second conductivity type electrode and converts an input optical signal into an electric signal; and a carrier that has a front surface on which the photodiode array is disposed so as to be connected thereto, and a rear surface located on an opposite side to the front surface, wherein the carrier includes plural pair of electric lines each of which is formed from a first electric line connected to the first conductivity type electrode of the corresponding light-receiving section and formed on a part of the front surface, and a second electric line connected to the second conductivity type electrode of the corresponding light-receiving section and formed on a part of the front surface adjacent to the first electric line; a first ground electrode that is formed on a part of the front surface and extends between one pair of electric lines of the plural pair of electric lines and a pair of electric lines adjacent to the one pair of electric lines; and a second ground electrode that is formed on at least a part of the rear surface and is electrically connected to the first ground electrode.

(2) In the light-receiving device array according to (1), the plural pair of electric lines may be a first pair of electric lines which is the one pair of electric lines a second pair of electric lines which is the pair of electric lines adjacent to the one pair of electric lines, the plural light-receiving sections may be a first light-receiving section which is connected to the first pair of electric lines and a second light-receiving section which is connected to the second pair of electric lines, and, in the first pair of electric lines and the second pair of electric lines, electric lines disposed inside with respect to the first ground electrode extending therebetween may be all the first electric lines.

(3) In the light-receiving device array according to any one of (1) and (2), the carrier may further include an upper surface located between the front surface upper edge and the rear surface upper edge, and both the first electric line and the second electric line of each pair of electric lines may extend toward the front surface upper edge, and may be formed on a part of the upper surface over the upper edge. In addition, the first ground electrode may extend toward the front surface upper edge between the one pair of electric lines and the pair of electric lines adjacent to the one pair of electric lines and is formed on a part of the upper surface over the upper edge.

(4) In the light-receiving device array according to (1), the first ground electrode may extend respectively between any two pairs of electric lines arranged in parallel so as to be adjacent to each other.

(5) In the light-receiving device array according to (4), the carrier may further include an upper surface located between the front surface upper edge and the rear surface upper edge, and both the first electric line and the second electric line of each pair of electric lines may extend toward the front surface upper edge, and may be formed on a part of the upper surface over the upper edge. In addition, the first ground electrode may extend toward the front surface upper edge respectively between any two pairs of electric lines arranged in parallel so as to be adjacent to each other, and is formed on a part of the upper surface over the upper edge.

(6) In the light-receiving device array according to (3), a portion where the first electric line of each pair of electric lines is formed on a part of the upper surface and a portion where the second electric line of the pair of electric lines is formed on a part of the upper surface may be electrically insulated from each other by a cutting groove.

(7) In the light-receiving device array according to (6), a portion where the first ground electrode is formed on a part of the upper surface may be included in an inner cutting groove. In addition, the corresponding portion may be electrically insulated from electric lines disposed inside with respect to the corresponding portion in the one pair of electric lines located further outside and the pair of electric lines adjacent to the one pair of electric lines by outer cutting grooves enlarging to both sides of the inner cutting groove.

(8) In the light-receiving device array according to (6), a portion where the first ground electrode is formed on a part of the upper surface may be electrically insulated from electric lines disposed inside with respect to the corresponding portion in the one pair of electric lines and the pair of electric lines adjacent to the one pair of electric lines by cutting grooves.

(9) In the light-receiving device array according to (5), a portion where the first electric line of each pair of electric lines is formed on a part of the upper surface and a portion where the second electric line of the pair of electric lines is formed on a part of the upper surface may be electrically insulated from each other by a cutting groove.

(10) In the light-receiving device array according to (9), each portion where the first ground electrode is formed on a part of the upper surface may be included in an inner cutting groove. In addition, the corresponding portion may be electrically insulated by outer cutting grooves enlarging to both sides of the inner cutting groove, from electric lines disposed inside with respect to the corresponding portion in the corresponding two pairs of electric lines so as to be adjacent to each other and be located further outside to both sides of the inner cutting groove respectively.

(11) In the light-receiving device array according to (9), each portion where the first ground electrode is formed on a part of the upper surface may be electrically insulated by cutting grooves from electric lines disposed inside with respect to the corresponding portion in the corresponding two pairs of electric lines so as to be adjacent to each other and be located at both sides of the corresponding portion.

(12) In the light-receiving device array according to (1), each of the light-receiving sections may further include a PN junction that receives light incident to a rear surface of the semiconductor substrate. Here, the first conductivity type electrode may be electrically connected to one side of the PN junction, and the second conductivity type electrode may be electrically connected to the other side of the PN junction.

(13) In the light-receiving device array according to (1), the carrier may further include one or plural through-holes that penetrate through an inside of a region where the first ground electrode is formed on the front surface and an inside of a region where the second ground electrode is formed on the rear surface, and the light-receiving device array may further include one or plural third ground electrodes that are respectively formed at lateral surfaces of the one or the plural through-holes and come into contact with the first ground electrode and the second ground electrode.

(14) In the light-receiving device array according to (1), the carrier may further include a bottom surface located between the front surface lower edge and the rear surface lower edge, and the light-receiving device array may further include a third ground electrode that comes into contact with the first ground electrode over the front surface lower edge, comes into contact with the second ground electrode over the rear surface lower edge, and is formed on a part of the bottom surface.

(15) In the light-receiving device array according to (5), a portion where the first ground electrode is formed on a part of the upper surface may extend toward the rear surface upper edge, and come into contact with the second ground electrode over the rear surface upper edge.

(16) According to another aspect of the present invention, there is provided an optical receiver module including the light-receiving device array according to any one of (1) to (15).

(17) According to another aspect of the present invention, there is provided an optical transceiver including the optical receiver module according to (16).

According to the present invention, it is possible to provide a light-receiving device array capable of reducing crosstalk occurring via plural electric lines disposed in the light-receiving device array having plural light-receiving sections, an optical receiver module, and an optical transceiver.

DETAILED DESCRIPTION OF THE INVENTION

Hereinafter, embodiments of the present invention will be described in detail. Here, the drawings described below are used only to illustrate the embodiment, and the sizes of the drawings and the scales in description of the embodiments do not correspond with each other.

First Embodiment

Figure 1:
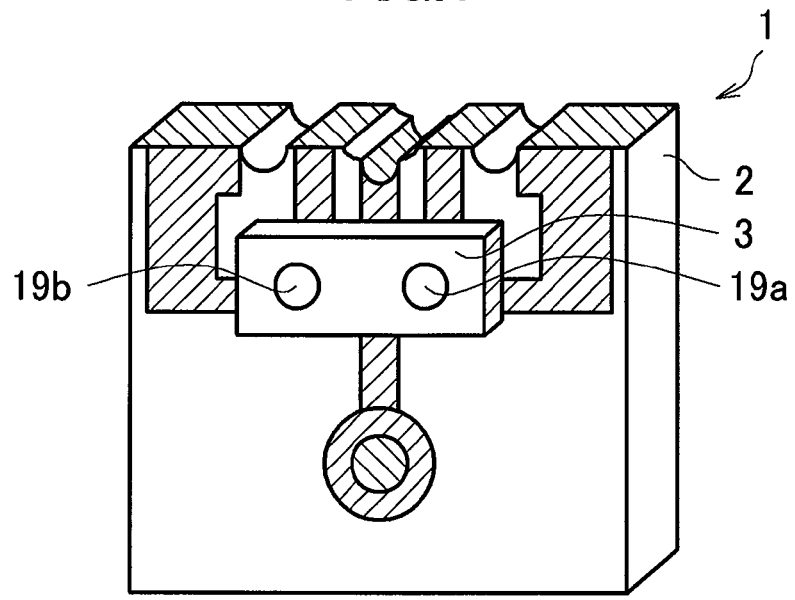
FIG. 1 is a perspective view when a light receiving device array according to a first embodiment of the present invention is viewed from the front surface side.

FIG. 1 is a perspective view when a light-receiving device array 1 according to a first embodiment of the present invention is viewed from the front surface side. The light-receiving device array 1 includes a carrier 2 and a photodiode array 3 held by the carrier 2. The photodiode array 3 is a two-channel photodiode array where two light-receiving sections are formed on a semiconductor substrate so as to be arranged in parallel. Here, a light-receiving section is also referred to as a photodetectable region. Two pairs of electrodes of the photodiode array 3 are respectively connected to two pairs of electric lines formed on the carrier 2. Light-receiving windows 19 are disposed on a rear surface of the semiconductor substrate of the photodiode array 3, and the photodiode array 3 receives light incident to the light-receiving window 19 and converts the incident light into an electric signal. The electric signal is amplified by a preamplifier circuit described later and is detected as a photocurrent. The two light-receiving sections are a first light-receiving section and a second light-receiving section in this order from the right side of the figure. The light-receiving windows 19 of the two light-receiving sections are shown as light-receiving windows 19a and 19b in this order from the right side of the figure.

Figure 2:
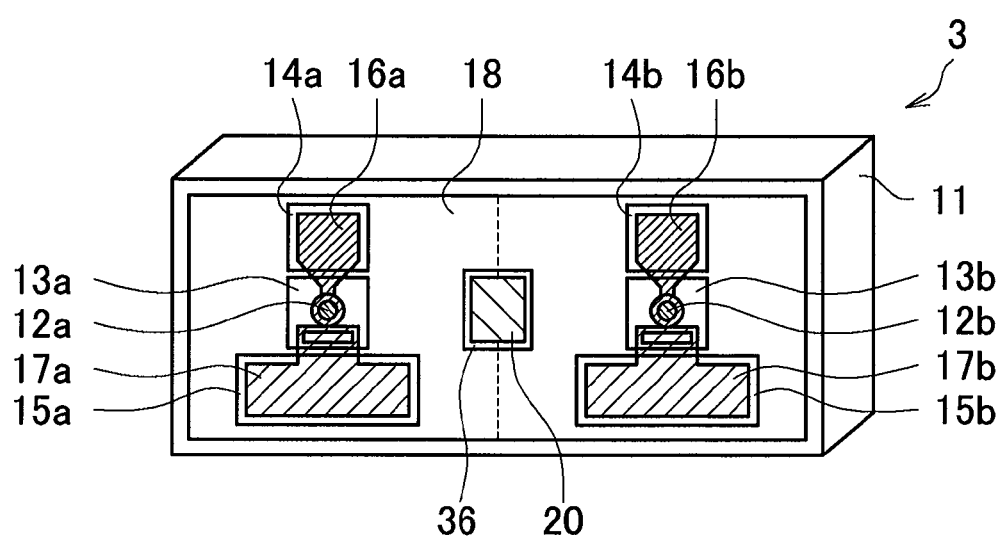
FIG. 2 is a perspective view when a photodiode array according to the first embodiment of the present invention is viewed from the electrode side.

FIG. 2 is a perspective view when the photodiode array 3 according to the present embodiment is viewed from the electrode side. The two light-receiving sections are the first light-receiving section and the second light-receiving section in this order from the left of the figure. Each of the light-receiving sections of the photodiode array 3 includes a PN junction for receiving incident light, and one side of the PN junction is a top of a photodetectable mesa 12, and the other side is an n type InP contact layer 13. Around (both sides of the upper and lower sides of the figure) the PN junction, a P type electrode mesa 14 and an N type electrode mesa 15 are formed. The P type electrode mesa 14 is provided with a P type electrode 16 (the first conductivity type electrode), and the P type electrode 16 is electrically connected to the top of the photodetectable mesa 12 which is the one side of the PN junction. The N type electrode mesa 15 is provided with an N type electrode 17 (the second conductivity type electrode), and the N type electrode 17 is electrically connected to the n type InP contact layer 13 which is the other side of the PN junction. In the figure, the photodetectable mesas 12 of the two light-receiving sections are shown as photodetectable mesas 12a and 12b in this order from the left, and, similarly, the n type InP contact layers 13 are shown as n type InP contact layers 13a and 13b, which are also same for the other portions.

In FIG. 2, a dummy electrode mesa 36 is formed between the two light-receiving sections, and a dummy electrode 20 is formed thereon. The dummy electrode 20 is not electrically connected to any of the P type electrodes 16a and 16b and the N type electrodes 17a and 17b. In addition, a shape of the dummy electrode mesa 36 and the dummy electrode 20 is not limited to the present embodiment shown in FIG. 2, and may be any shape or have any size as long as it is not electrically connected to the P type electrodes 16a and 16b and the N type electrodes 17a and 17b. A preferred shape as a modified example of the dummy electrode mesa 36 may be a stripe shape formed between the two light-receiving sections so as to enhance isolation of the two.

As shown in FIG. 2, in the photodiode array 3, the two n type InP contact layers 13a and 13b are formed on a semi-insulating Fe-doped InP substrate 11, and the photodetectable mesas 12a and 12b are respectively formed thereon. A gap between the centers of the photodetectable mesas 12a and 12b is 0.25 mm. Each of the photodetectable mesas 12a and 12b has a multi-layer structure formed from a P type InGaA contact layer, a P type InGaAlAs buffer layer, an N type InGaAs light absorbing layer, and an N type InGaAlAs buffer layer, when viewed from the top side. The photodetectable mesa 12a and the n type InP contact layer 13a, and the photodetectable mesa 12b and the n type InP contact layer 13b respectively form the PN junctions, and can receive light incident from the rear surface of the Fe-doped InP substrate 11 independently from each other. The entire surface of the Fe-doped InP substrate 11 is coated with an insulating protective film 18, but opening portions are provided in a circular pattern on the upper surfaces of the photodetectable mesas 12a and 12b and are provided in a rectangular pattern on a part of the n type InP contact layers 13a and 13b. The P type electrode mesa 14a and the N type electrode mesa 15a are formed around the photodetectable mesa 12a, and the P type electrode mesa 14b and the N type electrode mesa 15b are formed around the photodetectable mesa 12b. The heights thereof are equal to or larger than the heights of the photodetectable mesas 12a and 12b. The P type electrode 16a is drawn out to the upper surface of the P type electrode mesa 14a so that the P type electrode 16a is electrically connected via the opening portion to the P type InGaAs contact layer which is the top of the photodetectable mesa 12a, and the N type electrode 17a is drawn out to the upper surface of the N type electrode mesa 15a so that the N type electrode 17a is electrically connected via the opening portion to the n type InP contact layer 13a. These are also the same for the P type electrode 16b and the N type electrode 17b of the second light-receiving section.

Further, the dummy electrode mesa 36 is formed between the photodetectable mesa 12a and the photodetectable mesa 12b, and the height thereof is equal to or larger than the heights of the photodetectable mesas 12a and 12b.

Figure 3A:
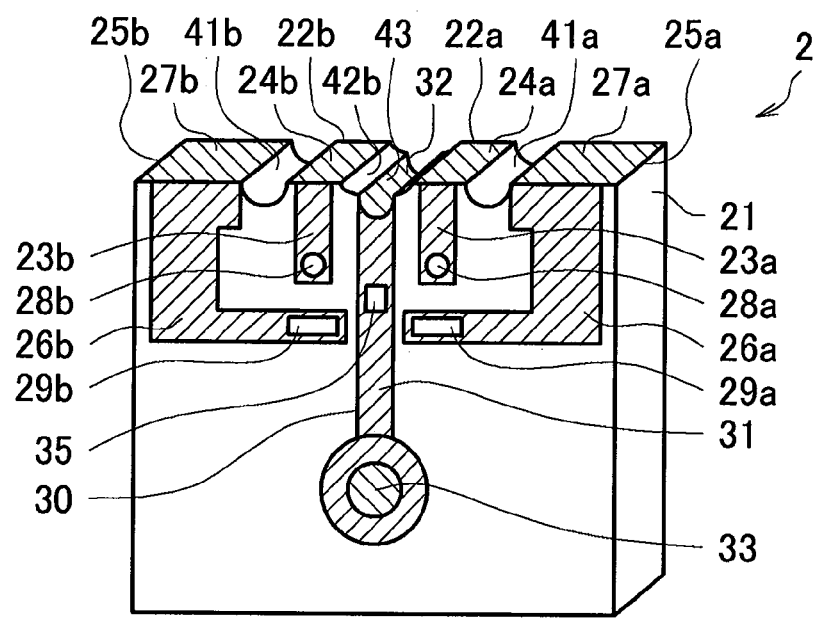
FIG. 3A is a perspective view when a carrier according to the first embodiment of the present invention is viewed from the front surface side.
Figure 3B:
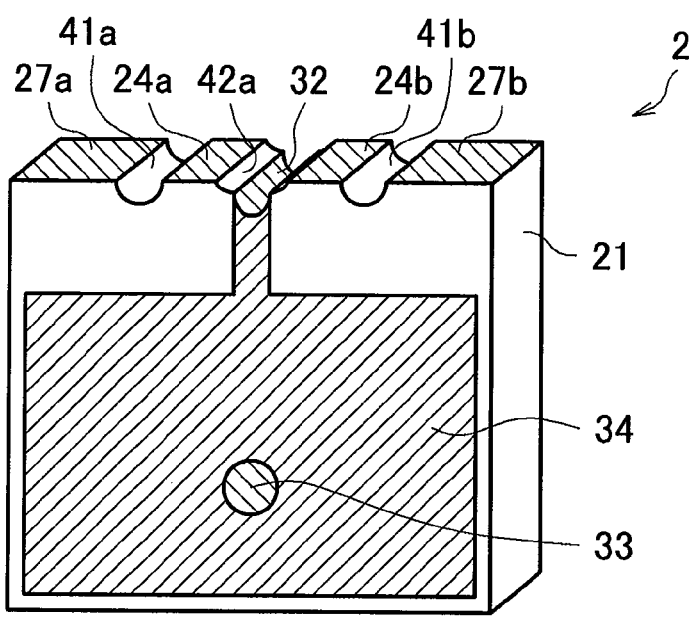
FIG. 3B is a perspective view when the carrier according to the first embodiment of the present invention is viewed from the rear surface side.

FIG. 3A is a perspective view when the carrier 2 according to the present embodiment is viewed from the front surface side. FIG. 3B is a perspective view when the carrier 2 according to the present embodiment is viewed from the rear surface side. The carrier 2 has a front surface on which the photodiode array 3 is disposed so as to be connected thereto, a rear surface located on an opposite side to the front surface, an upper surface located so as to extend between the front surface upper edge and the rear surface upper edge, a bottom surface located so as to extend between the front surface lower edge and the rear surface lower edge, and two lateral surfaces. Here, the upper surface is a surface formed from plural planes and plural curved surfaces disposed between the adjacent planes. In the carrier 2, two pairs of electric lines respectively connected to two pairs of electrodes of the photodiode array 3 and a ground electrode 30 are formed an aluminum nitride member 21 of the width 1 mm (the distance between the right edge and the left edge of the rear surface), the height 1 mm (the distance between the rear surface upper edge and lower edge), and the thickness 0.15 mm (the distance between the front surface upper edge and the rear surface upper edge). A main feature of the light-receiving device array 1 according to the present embodiment lies in a shape of the ground electrode 30.

A first pair of electric lines connected to the first light-receiving section is shown in the right part of FIG. 3A, and a second pair of electric lines connected to the second light-receiving section is shown in the left part of FIG. 3A. The first pair of electric lines is formed from a P type electric line 22a (the first electric line), and an N type electric line 25a (the second electric line). The P type electric line 22a is formed on a part of each of the front surface and the upper surface over the front surface upper edge, and is formed from a front surface P type electric line electrode 23a formed on the front surface and an upper surface P type electric line electrode 24a formed on the upper surface. Similarly, the N type electric line 25a is formed from a front surface N type electric line electrode 26a formed on a part of the front surface and an upper surface N type electric line electrode 27a formed on a part of the upper surface. In the same manner as the first pair of electric lines, the second pair of electric lines is formed from a P type electric line 22b (the first electric line), and an N type electric line 25b (the second electric line). The P type electric line 22b is formed from a front surface P type electric line electrode 23b and an upper surface P type electric line electrode 24b, and the N type electric line 25a is formed from a front surface N type electric line electrode 26b and an upper surface N type electric line electrode 27b. Here, two pairs of electric lines, as shown in FIG. 3A, are arranged adjacently to each other on the front surface of the carrier 2 in the order of the N type electric line 25a, the P type electric line 22a, the P type electric line 22b, and the N type electric line 25b from the right side of the figure.

At parts of the front surface P type electric line electrodes 23a and 23b and the front surface N type electric line electrodes 26a and 26b, AuSn solder materials 28a, 28b, 29a and 29b are respectively formed. When the photodiode array 3 is mounted on the carrier 2, the P type electrode 16a is electrically connected to the AuSn solder material 28a, the P type electrode 16b is electrically connected to the AuSn solder material 28b, the N type electrode 17a is electrically connected to the AuSn solder material 29a, and the N type electrode 17b is electrically connected to the AuSn solder material 29b, through soldering connection, and the photodiode array 3 is fixed to the carrier 2 such that the carrier 2 can hold the photodiode array 3.

In addition, as described later, an AuSn solder material 35 is formed on a part of a front surface ground electrode 31. When the photodiode array 3 is mounted on the carrier 2, the dummy electrode 20 is connected by soldering to the AuSn solder material 35 such that the photodiode array 3 is fixed to the carrier 2 more stably.

As shown in FIG. 3A, the front surface P type electric line electrode 23a linearly extends from one end (lower end) where the AuSn solder material 28a is formed toward the front surface upper edge with the same width, and reaches the front surface upper edge. In addition, the front surface N type electric line electrode 26a linearly extends from one end (lower left end) where the AuSn solder material 29a is formed toward the right side of the front surface with the same width, curves perpendicularly, linearly extends towards the upper side of the front surface, further increases in width on the way, and reaches the front surface upper edge. The front surface N type electric line electrode 26a is formed together with the front surface P type electric line electrode 23a. The front surface P type electric line electrode 23b and the front surface N type electric line electrode 26b are formed on the left side of the figure, symmetrically to a stripe-shaped portion of the front surface ground electrode 31 described later.

The ground electrode 30 is formed from a first ground electrode, a second ground electrode, and a third ground electrode. The first ground electrode is formed on a part of each of the front surface and the upper surface over the front surface upper edge, and is formed from the front surface ground electrode 31 formed on the front surface and an upper surface ground electrode 32 formed on the upper surface. The second ground electrode is a rear surface ground electrode 34, and the rear surface ground electrode 34 reaches a part of the rear surface upper edge and comes into contact with the upper surface ground electrode 32 over a part of the upper edge. A through-hole which penetrates through the inside of the region where the front surface ground electrode 31 (the first ground electrode) is formed on the front surface and the inside of the region where the rear surface ground electrode 34 is formed on the rear surface is formed in the carrier 2, and a through-hole ground electrode 33 is formed at the lateral surface of the through-hole. The third ground electrode is the through-hole ground electrode 33, and the through-hole ground electrode 33 comes into contact with the front surface ground electrode 31 (the first ground electrode) and the rear surface ground electrode 34 (the second ground electrode) over both ends of the through-hole. The first ground electrode and the second ground electrode are electrically connected to each other via the third ground electrode. In addition, the first ground electrode and the second ground electrode come into contact with each other over the rear surface upper edge, and are thereby electrically connected to each other. In addition, here, the single through-hole ground electrode 33 is formed, but the number thereof is not limited to one, and one or plural through-hole ground electrodes may be employed. A voltage applied to the first ground electrode is preferably stable and is maintained at a reference voltage, and means for electrically connecting the first ground electrode to the second ground electrode may be selected as necessary. In the carrier 2 according to the present embodiment, both the ends of the third ground electrode respectively come into contact with the first ground electrode and the second ground electrode, and the first ground electrode and the second ground electrode come into contact with each other over the rear surface upper edge, such that the first ground electrode is stably electrically connected to the second ground electrode. In addition, for example, a ground electrode is formed over the entire bottom surface of the carrier 2 such that the first ground electrode may be electrically connected to the second ground electrode.

The front surface ground electrode 31 is formed from a ring-shape portion which surrounds one end (circular shape) on the front surface ground electrode 31 side of the through-hole ground electrode 33 and the strip-shaped portion which linearly extends toward the upper side with the same width from the ring-shaped portion and reaches the front surface upper edge. The AuSn solder material 35 is formed on a part of the strip-shaped portion of the front surface ground electrode 31, and the dummy electrode 20 is connected to the AuSn solder material 35 by soldering when the photodiode array 3 is mounted on the carrier 2. The front surface ground electrode 31 (the first ground electrode) extends to the front surface upper edge between the first pair of electric lines (one pair of electric lines) and the second pair of electric lines (a pair of electric lines located around the first pair of electric lines). As shown in FIG. 3A, in the first pair of electric lines and the second pair of electric lines, electric lines disposed inside with respect to the strip-shaped portion of the front surface ground electrode 31 are the P type electric lines 22a and 22b, and since the two P type electric lines 22a and 22b are disposed in parallel so as to be close to each other, electrical crosstalk may possibly be generated. However, the front surface ground electrode 31 is disposed between the two P type electric lines 22a and 22b, and thus the electrical crosstalk is suppressed. In addition, the N type electric lines 25a and 25b are close to each other at the ends of the front surface N type electric line electrodes 26a and 26b where the AuSn solder materials 29a and 29b are formed. At a location where the electrical crosstalk may possibly be generated even around the ends of the front surface N type electric line electrodes 26a and 26b, the electrical crosstalk is suppressed by the front surface ground electrode 31. Further, the electrode side of the photodiode array 3 is disposed so as to be connected in the carrier 2 of the light-receiving device array 1, and thus electrical crosstalk which may possibly be generated between the two light-receiving sections of the photodiode array 3 is also suppressed by the front surface ground electrode 31. The dummy electrode 20 of the photodiode array 3 and the front surface ground electrode 31 of the carrier 2 are connected to each other by soldering through the AuSn solder material 35, and thus it is possible to achieve a notable effect that electrical crosstalk is further suppressed.

In addition, as described above, two pairs of electric lines and the ground electrode 30 are also respectively formed on a part of the upper surface of the carrier 2. As shown in FIG. 3A, the upper surface P type electric line electrode 24a is formed on a part of the upper surface and comes into contact with the front surface P type electric line electrode 23a which reaches the front surface upper edge. Similarly, the upper surface N type electric line electrode 27a is formed on a part of the upper surface and comes into contact with the front surface N type electric line electrode 26a which reaches the front surface upper edge. In addition, the upper surface N type electric line electrode 27a is formed along with the upper surface P type electric line electrode 24a. The upper surface P type electric line electrode 24b and the upper surface N type electric line electrode 27b is formed at the left part of the figure symmetrically to the upper surface ground electrode 32. Therefore, in the upper surface of the carrier 2 as well, the upper surface ground electrode 32 is disposed between the two upper surface P type electric line electrodes 24a and 24b. In other words, the upper surface ground electrode 32 (the first ground electrode) is formed between the first pair of electric lines (one pair of electric lines) and the second pair of electric lines (a pair of electric lines located around one pair of electric lines), and, in the upper surface as well, the ground electrode is disposed between the two P type electric lines 22a and 22b, thereby suppressing electrical crosstalk which may possibly occur in the upper surface.

As shown in FIGS. 3A and 3B, the upper surface of the carrier 2 includes plural cutting grooves formed through cutting described later, and plural electrodes are electrically insulated from each other by the cutting grooves. A gap between the center of the upper surface P type electric line electrode 24a and the center of the upper surface P type electric line electrode 24b is 0.25 mm. On the upper surface of the carrier 2, the cutting groove 41 is disposed between the P type electric line 22 and the N type electric line 25 of each pair of electric lines, a conductive material such as a metal is not formed in the cutting groove 41, and thus the P type electric line 22 and the N type electric line 25 of each pair of electric lines are electrically insulated from each other by the cutting groove 41. In FIGS. 3A and 3B, the cutting groove 41a disposed between the upper surface P type electric line electrode 24a and the upper surface N type electric line electrode 27a, and the cutting groove 41b disposed between the upper surface P type electric line electrode 24b and the upper surface N type electric line electrode 27b are shown. In addition, as described above, the upper surface ground electrode 32 is disposed between the two upper surface P type electric line electrodes 24a and 24b, and the upper surface ground electrode 32 is formed at an inner cutting groove 43 of the upper surface of the carrier 2. In addition, the upper surface ground electrode 32 may be formed on at least a part of the curved surface of the inner cutting groove 43, and, at this time, the upper surface ground electrode 32 is included in the curved surface region of the inner cutting groove 43. Preferably, the upper surface ground electrode 32 reaches the front surface upper edge and comes into contact with the front surface ground electrode 31, and reaches the rear surface upper edge and comes into contact with the rear surface ground electrode 34. An outer cutting groove 42a (not shown) is formed on the upper surface on the right side of FIG. 3A of the inner cutting groove 43, and an outer cutting groove 42b is formed on the upper surface on the left side thereof. A conductive material such as a metal is not formed on the outer cutting grooves 42a and 42b, and the upper surface ground electrode 32 formed at the inner cutting groove 43 is electrically insulated from the two upper surface P type electric line electrodes 24a and 24b which are disposed further outside by the outer cutting grooves 42a and 42b, respectively. The inner cutting groove 43 and the outer cutting grooves 42a and 42b disposed at both sides thereof have a difference in the curvature of the curved surfaces of the cutting grooves. The radius of curvature of the curved surface of the inner cutting groove 43 is smaller than the radius of curvature of the curved surface formed by each of the outer cutting grooves 42a and 42b, and, that is, the curvature of the former is larger than the curvature of the latter.

Figure 4A:
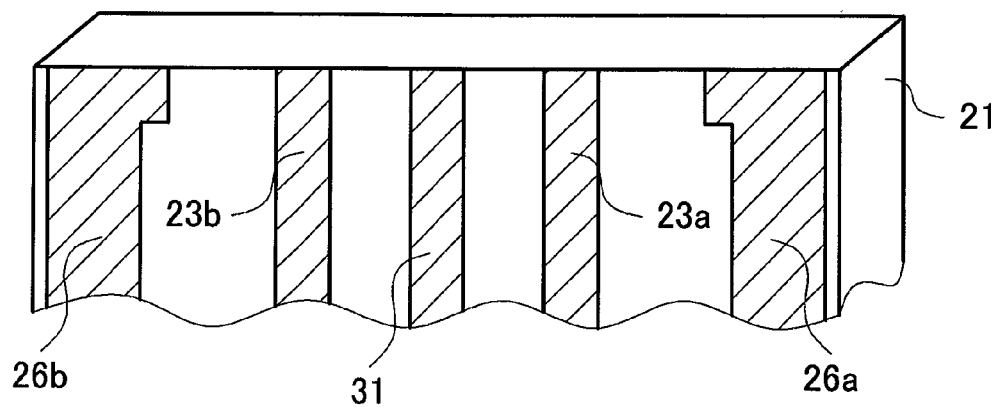
FIG. 4A is a schematic perspective view illustrating a carrier manufacturing process according to the first embodiment of the present invention.

Hereinafter, a part of the manufacturing method of the carrier 2 according to the embodiment will be described. FIGS. 4A to 4D are schematic perspective views illustrating a manufacturing process of the carrier 2 according to the present embodiment. Ti/Pt/Au films are deposited on the front surface of the aluminum nitride member 21 according to a deposition method, such that the front surface P type electric line electrodes 23a and 23b, the front surface N type electric line electrodes 26a and 26b, the front surface ground electrode 31 are formed in a desired shape (FIG. 4A). Here, "/" in Ti/Pt/Au denotes the order from a close side a far side with respect to the substrate, and this is also same throughout the specification. In addition, needless to say, the electrode material is not limited to the Ti/Pt/Au films.

Figure 4B:
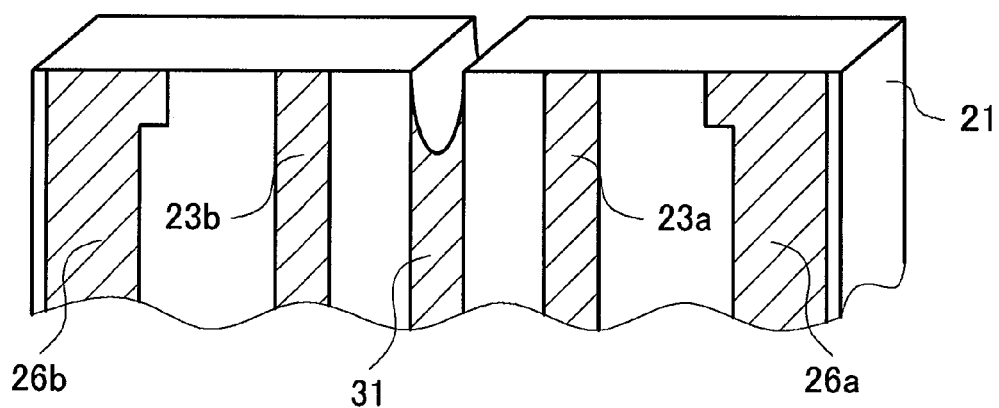
FIG. 4B is a schematic perspective view illustrating the carrier manufacturing process according to the first embodiment of the present invention.
Figure 4C:
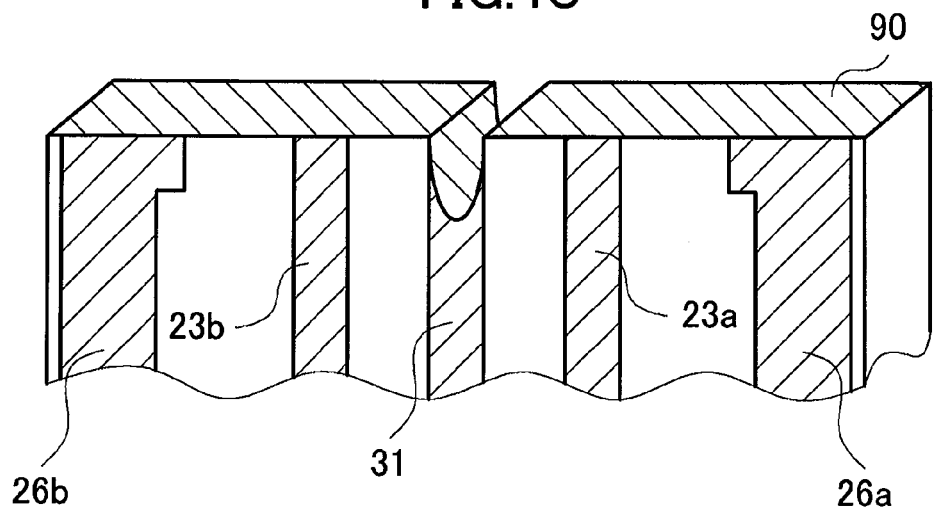
FIG. 4C is a schematic perspective view illustrating the carrier manufacturing process according to the first embodiment of the present invention.
Figure 4D:
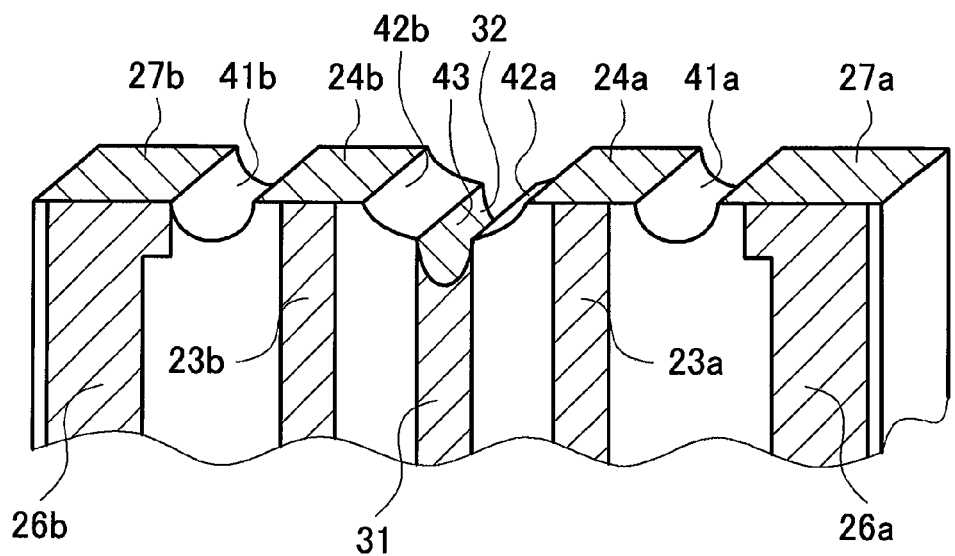
FIG. 4D is a schematic perspective view illustrating the carrier manufacturing process according to the first embodiment of the present invention.

A cutting groove is formed by a cutting process at a region where the upper surface ground electrode 32 is formed on the upper surface of the aluminum nitride member 21 (FIG. 4B). This cutting groove will become the inner cutting groove 43 later. In addition, a conductive film 90 formed from Ti/Pt/Au films is formed on the entire upper surface of the aluminum nitride member 21 (FIG. 4C). At this time, the conductive film 90 is also formed at the curved surface of the cutting groove.

Next, the cutting grooves 41a and 41b and the outer cutting grooves 42a and 42b are formed through a cutting process. At this time, a cutting groove having a curved surface which is shallower and has smaller curvature (larger radius of curvature) than that of the cutting groove shown in FIG. 4B is formed, and thereby, in the cutting groove shown in FIG. 4B, a remaining portion (is not cut through the cutting process) after the cutting process becomes the inner cutting groove 43, and the conductive film 90 formed at the inner cutting groove 43 becomes the upper surface ground electrode 32. In addition, cutting grooves which are newly formed by the cutting process become the outer cutting grooves 42a and 42b. In addition, by forming the cutting grooves 41a and 41b, the conductive film 90 formed on the upper surface (the plane thereof) becomes the upper surface N type electric line electrode 27a, the upper surface P type electric line electrode 24a, the upper surface P type electric line electrode 24b, and the upper surface N type electric line electrode 27b in this order from the right side of FIG. 4D. Therefore, the upper surface ground electrode 32 (first ground electrode) is electrically insulated from the upper surface P type electric line electrodes 24a and 24b (P type electric lines 22a and 22b) disposed further outside by the outer cutting grooves 42a and 42b, and the P type electric line 22 and the N type electric line 25 of each pair of electric lines are electrically insulated from each other by the cutting groove 41.

A result of performing a characteristic evaluation for the light-receiving device array 1 according to the present embodiment is shown below. Here, in order to evaluate characteristics of the first light-receiving section of the photodiode array 3, the N type electric line 25a is grounded, a reverse bias voltage of 3 V is applied to the P type electric line 22a, and an optical signal of the wavelength 1550 nm and the intensity 10 μW is input to the light-receiving window 19a. As a result, light-receiving sensitivity of 0.7 A/W could be obtained. A dark current at the reverse bias voltage of 3V is 3 nA or less at the room temperature and 30 nA at 85° C., which are sufficiently low values. In a high temperature reverse bias conduction test (200° C. and 6V), a dark current after 2000 hours is 100 nA at 85° C., which indicated high reliability. Capacitance between terminals is 100 fF including parasitic capacitance occurring at the first pair of electric lines of the carrier 2, and forward resistance is 20Ω. As a result of measuring frequency response characteristics by applying a reverse bias voltage of 3V and inputting an optical signal of the wavelength 1550 nm and the intensity 100 μW, it is possible to obtain a 3 dB cutoff frequency of 25 GHz or more at 85° C. and an intra-band deviation of 1 dB or less.

Similarly, in order to evaluate characteristics of the second light-receiving section of the photodiode array 3, the N type electric line 25b is grounded, a reverse bias voltage of 3V is applied to the P type electric line 22b, and a test as described above is performed. As a result, it is possible to obtain characteristics of the same extent. Particularly, the light-receiving sensitivity and the inter-channel deviation of the 3 dB cutoff frequency are within 3%.

Figure 5:
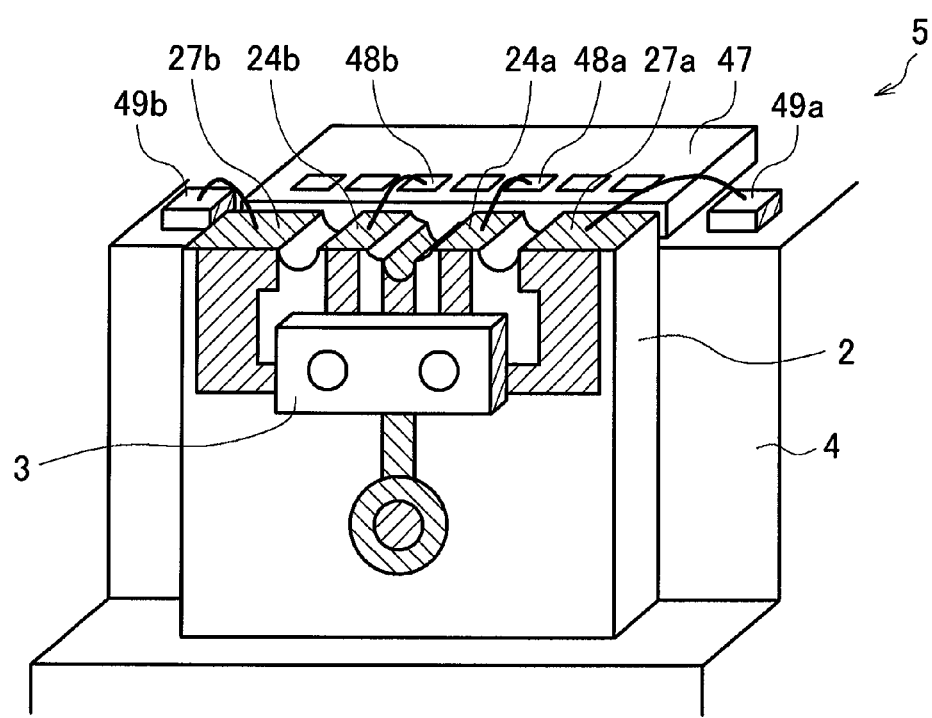
FIG. 5 is a perspective view when main parts of an optical receiver module according to the first embodiment of the present invention are viewed from the front surface side.

FIG. 5 is a perspective view when main parts of an optical receiver module 5 according to the present embodiment are viewed from the front surface side. The optical receiver module 5 according to the present embodiment is a DQPSK optical receiver module which has transmission capacity of 40 Gbps. The optical receiver module 5 according to the present embodiment includes a base 4, and the light-receiving device array 1 is connected to and disposed at the base 4. The base 4 is formed by a conductive material such as a metal, and includes a stepped part connecting a lower-stage surface, a rising surface and an upper-stage surface in this order. As shown in FIG. 5, the light-receiving device array 1 is disposed at the stepped part of the base 4 such that the rear surface of the carrier 2 of the light-receiving device array 1 is disposed along the rising surface of the base 4, and the bottom surface of the carrier 2 is disposed along the lower-stage surface of the base 4.

A preamplifier circuit 47 is provided on the upper-stage surface of the base 4 of the optical receiver module 5. The preamplifier circuit 47 amplifies an electric signal output by the photodiode array 3, and signal voltage terminals 48a and 48*b* and the like are disposed on the preamplifier circuit 47. A gap between the respective centers of the signal voltage terminals 48*a* and 48*b* is 0.25 mm.

The upper surface of the carrier 2 of the light-receiving device array 1 is higher than the upper-stage surface of the base 4. In addition, the preamplifier circuit 47 is disposed around the edge with the rising surface on the upper-stage surface of the base 4. In addition, the gap between the signal voltage terminals 48*a* and 48*b* is the same as the gap between the upper surface P type electric line electrodes 24*a* and 24*b*, and the light-receiving device array 1 and the preamplifier circuit 47 are disposed at the base 4 so as to be close to each other, thereby making the length of the pattern connection wire shortest.

At both sides of the preamplifier circuit 47, reference voltage terminals 49*a* and 49*b* are disposed on the upper-stage surface of the base 4. The upper surface N type electric line electrodes 27*a* and 27*b* are respectively electrically connected to the reference voltage terminals 49*a* and 49*b* via the pattern connection wires. Also here, preferably, the reference voltage terminals 49*a* and 49*b* are disposed on the upper-stage surface of the base 4 in order to make the lengths of the pattern connection wire short. Here, the base 4 provides a reference voltage, the rear surface ground electrode 34 (not shown) formed at the carrier 2 is connected to and disposed at the rising surface of the base 4, and thereby the ground electrode 30 of the carrier 2 is electrically connected to the base 4. When the base 4 is grounded, the reference voltage is 0 V, and thus a voltage applied to the N type electric lines 25 of the carrier 2 and the N type electrodes 17 of the photodiode array 3 is 0 V which is the reference voltage.

In a case where a voltage applied to the two N type electrodes 17*a* and 17*b* of the photodiode array 3 and a voltage the two N type electric lines 25*a* and 25*b* of the carrier 2 which are respectively connected to the two N type electrodes 17*a* and 17*b* are all 0 V which is the reference voltage, electrical crosstalk may mainly occur between the two P type electrodes 16*a* and 16*b* of the photodiode array 3, and between the P type electric lines 22*a* and 22*b* connected to the P type electrodes 16*a* and 16*b*, respectively. Particularly, since, among two pairs of electric lines (four electric lines) disposed together, the two P type electric lines 22*a* and 22*b* extend so as to be adjacent to the inside, the strip-shaped portion of the front surface ground electrode 31 (the first ground electrode) extends between the two P type electric lines 22*a* and 22*b* in the portions where electrical crosstalk easily may occur between the two P type electric lines 22*a* and 22*b* without the strip-shaped portion of the front surface ground electrode 31, and thus the electrical crosstalk is suppressed. In other words, in a case where the two pairs of electric lines are arranged together in the order of the N type electric line 25*a*, the P type electric line 22*a*, the P type electric line 22*b*, and the N type electric line 25*b* on the front surface of the carrier 2 from the right side of the figure as shown in FIG. 3A, and the N type electric lines 25*a* and 25*b* are grounded, the effect of the present invention is more notably shown. In addition, as described above, the dummy electrode 20 of the photodiode array 3 is connected to the front surface ground electrode 31 of the carrier 2 by soldering through the AuSn solder material 35, and thus it is possible to achieve a notable effect that electrical crosstalk is further suppressed.

In addition to the light-receiving device array 1 and the preamplifier circuit 47 shown in FIG. 5, the optical receiver module 5 is further provided with an interference optical system (not shown) formed from optical system components such as lenses, mirrors, and half beam splitters, and a photodiode bias circuit (not shown) necessary to be operated as the DQPSK optical receiver module. An optical fiber is connected to an input side of the optical receiver module 5, and when a DQPSK optical signal is input, the signal is interfered in the interference optical system, and is received by the photodiode array 3, and is converted into an electric signal by the photodiode array 3 so as to be output. An optical transceiver according to the present embodiment is an optical transceiver having the optical receiver module 5 according to the present embodiment.

In order to improve the high-speed response characteristic of the optical receiver module 5, it is preferable to shorten the pattern connection wires which connect the P type electric lines 22 formed at the carrier 2 of the light-receiving device array 1 to the preamplifier circuit 47. In order to shorten the wires, as described above, preferably, a gap between the signal voltage terminals 48*a* and 48*b* is the same as the gap between the upper surface P type electric line electrodes 24*a* and 24*b*, and the light-receiving device array 1 and the preamplifier circuit 47 are disposed at the base 4 such that the signal voltage terminals 48*a* and 48*b* are respectively close to the upper surface P type electric line electrodes 24*a* and 24*b*. In addition, the height of the plane portion of the upper surface of the carrier 2 and the height of the upper surface of the preamplifier circuit 47 disposed on the upper-stage surface of the base 4 are preferably similar values, and are more preferably the same value.

In order to further shorten the wires, the thickness of the carrier 2 (a distance between the front surface upper edge and the rear surface upper edge), that is, the width of the upper surface is more preferably further decreased. However, in a case where the width of the upper surface of the carrier 2 is small, it is difficult to form an electrode electric line pattern through a photolithography process, and thus electric lines are separated from each other by cutting grooves formed through the cutting process, as in the manufacturing method according to the present embodiment. However, there are cases where, since a limitation is imposed on the width of a cutting groove or the width of an electrode formed on the upper surface depending on accuracy of positional deviation in the cutting process, it is difficult to provide a ground electrode between adjacent electric lines.

Figure 12:
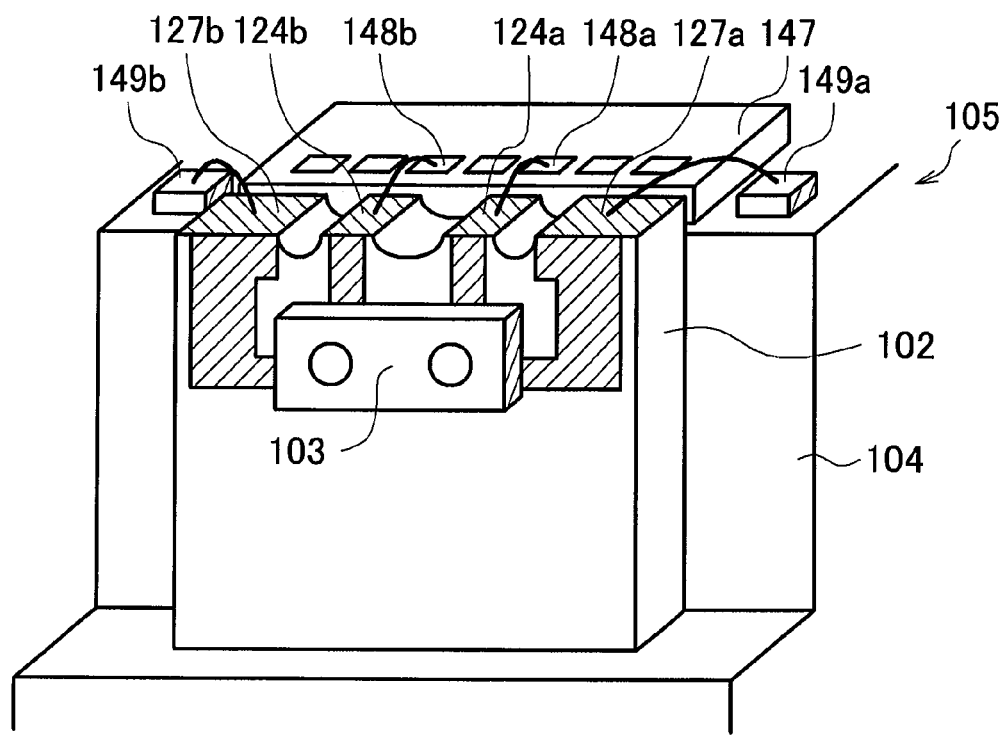
FIG. 12 is a perspective view when main parts of an optical receiver module according to the related art are viewed from the front surface side.

Here, although the gap between the signal voltage terminals 48*a* and 48*b* of the preamplifier circuit 47 is 0.25 mm, a case where the width of the cutting groove of 0.1 mm or more and the width of the electric line electrode of 0.1 mm or more are necessary in the design depending on the accuracy of positional deviation in the cutting process will be described as an example. For example, as in the carrier 102 according to the related art shown in FIG. 12, in the case where the ground electrode is not disposed on the front surface, when a gap between the signal voltage terminals 148*a* and 148*b* is 0.25 mm, a distance between the centers of the two P type electric lines can be made to be the same as the gap between the signal voltage terminals 148*a* and 148*b* of the preamplifier circuit. However, as in the light-receiving device array 1 according to the present embodiment, in the case where the first ground electrode is disposed between the two P type electric lines 22*a* and 22*b*, a distance between the centers of the two P type electric lines requires 0.4 mm or more due to the above-described limitation depending on the accuracy of positional deviation in the cutting process, and when a gap between the signal voltage terminals is 0.25 mm, there is a problem in that a distance between the two P type electric lines cannot be made to be the same as the gap between the signal voltage terminals of the preamplifier circuit and thus both of the gaps do not match each other. However, in the light-receiving device array 1 according to the present embodiment, the upper surface ground electrode 32 of the carrier 2 is formed at the inner cutting groove 43, and the upper surface ground electrode 32 is electrically insulated from the upper surface P type electric line electrodes 24a and 24b by the outer cutting grooves 42a and 42b, thereby solving the related problems and further achieving the effects of the present invention.

In recent years, with the acceleration of transmission capacity in the optical module, there have been used an optical wavelength division multiplex transmission where a carrier wave is multiplexed by simultaneously transmitting and receiving plural light rays having different wavelengths, or a method, called PSK (Phase Shift Keying) where a signal obtained by modulating a phase of light is propagated. In an optical transmitter module used for such an optical transmission method, a small-sized, low cost, low power consumption optical transmitter module has been developed by using a semiconductor laser array where plural semiconductor laser diodes are arranged linearly and a driving circuit including plural signal terminals, and, in an optical receiver module, a small-sized, low cost, low power consumption optical receiver module has been developed by using a photodiode array where plural semiconductor photodiodes are arranged linearly and a preamplifier circuit including plural signal terminals.

In a case where a (front) surface illuminated (or top illuminated) photodiode array or a back illuminated photodiode array is embedded in an optical receiver module, it is necessary to perpendicularly mount the light-receiving surface of the photodiode array with respect to a bottom surface of the optical receiver module, that is, a surface to which the photodiode array is fixed when embedded in the optical transceiver, since a circuit board such as the preamplifier circuit and the optical receiver module where an input direction of an optical signal are parallel to the bottom surface of the optical receiver module. In this case, a carrier having electrode electric lines from the front surface over the upper surface is employed, and the photodiode array is mounted on the front surface. Further, the carrier is mounted around the preamplifier circuit, and connection is performed from the electrode electric line portion of the upper surface of the carrier to the respective terminals of the preamplifier circuit. In this case, electrical crosstalk is suppressed by the light-receiving device array 1 according to the present embodiment in the portions where the electrical crosstalk between adjacent electric lines is problematic in not only the front surface of the carrier but also the upper surface. If the electrical crosstalk is suppressed, noise generated by the light-receiving device array 1 is suppressed, and thus operation errors of the optical module and the optical transceiver including the light-receiving device array 1 embedded therein are suppressed.

Particularly, as in the light-receiving device array 1 according to the present embodiment, in the case of the two-channel light-receiving device array embedded in the DQPSK optical receiver module, the electric lines connected to the two light-receiving sections are arranged in the order of the N type, the P type, the P type, and the N type, and thus the present invention is applied to the portions where the electrical crosstalk is problematic since the P type electric lines between two channels are adjacent to each other. Therefore, the electrical crosstalk is considerably reduced, and thereby the effects of the present invention are further achieved.

In addition, although the photodiode array 3 of the light-receiving device array 1 according to the present embodiment has the back illuminated light-receiving section which receives light incident from the rear surface of the semiconductor substrate, the present invention is not limited thereto, and a surface illuminated light-receiving section may be used.

In addition, although the carrier 2 of the light-receiving device array 1 according to the present embodiment is a vertical type carrier which is mounted vertically with respect to the bottom surface (the upper-stage surface and the lower-stage surface of the base 4) of the optical receiver module 5, the present invention is not limited thereto, and, for example, a planar carrier which is mounted in parallel on the bottom surface of the optical receiver module 5 may be used. In this case, it is not necessary to form electrodes on the upper surface of the carrier 2, and a pair of electric lines connected to each light-receiving section is formed only on the front surface of the carrier 2. In this case as well, a ground electrode extends between a pair of electric lines adjacent to each other, and thereby electrical crosstalk is suppressed. In this case as well, if electric lines inside the pairs of electric lines are P type electric lines (first electric lines), the effects of the present invention become notable.

In addition, the carrier 2 according to the present embodiment has a rectangular solid shape where the front surface and the rear surface are parallel to each other and the cutting grooves formed on the upper surface are excluded, the present invention is not limited thereto. In order to decrease the width of the upper surface and in order to suppress reflected light from the light-receiving surface (for example, the light-receiving windows 19) of the photodiode array 3 from returning to the input side, a shape where the width (a distance between the front surface upper edge and the rear surface upper edge) of the upper surface is smaller than the width (a distance between the front surface lower edge and the rear surface lower edge) of the bottom surface may be employed. In this case, the light-receiving windows 19 of the photodiode array 3 is not disposed vertically to the bottom surface of the carrier 2, and the front surface of the carrier 2 and the light-receiving windows 19 of the photodiode array 3 are inclined with the bottom surface. If necessary, conversely, a shape where the width of the upper surface is larger than the width of the bottom surface may be employed.

In addition, the light-receiving device array 1 according to the present embodiment is provided with the rear surface ground electrode 34 in order to increase the electrical crosstalk reduction effect by the front surface ground electrode 31, but this is not essential. In addition, although, in order to increase the electrical crosstalk reduction effect, the front surface ground electrode 31 and the rear surface ground electrode 34 are electrically connected to each other via both the upper surface ground electrode 32 and the through-hole ground electrode 33, thereby enhancing electrical connection, this is not essential, and either the upper surface ground electrode 32 or the through-hole ground electrode 33 may be provided.

Second Embodiment

A basic configuration of a light-receiving device array 9 according to the second embodiment of the present invention is the same as that of the light-receiving device array 1 according to the first embodiment. The light-receiving device array 9 according to the present embodiment is different from the light-receiving device array 1 according to the first embodiment in a front surface and an upper surface of a carrier 10.

The light-receiving device array 9 according to the present embodiment is different from the light-receiving device array 1 according to the first embodiment in a shape of the electric line electrode pattern, and presence or absence of the through-hole ground electrode 33.

Figure 6A:
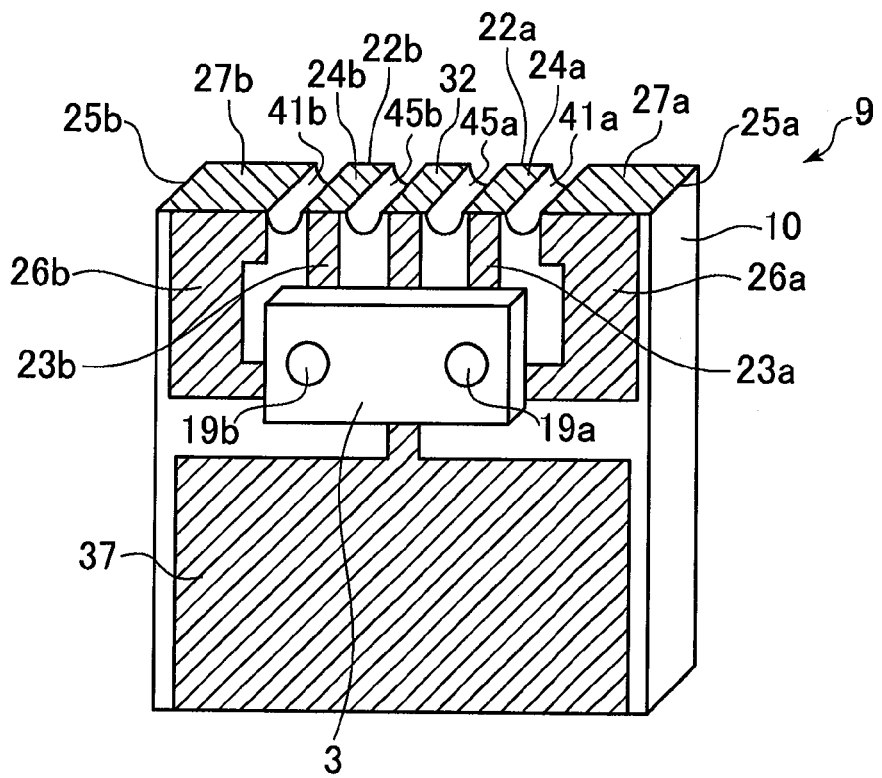
FIG. 6A is a perspective view when a light receiving device array according to a second embodiment of the present invention is viewed from the front surface side.
Figure 6B:
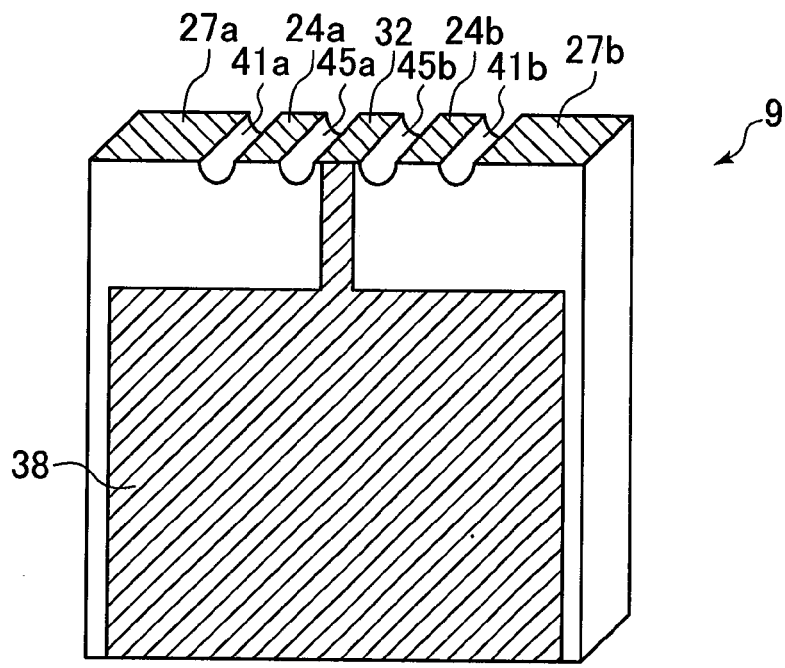
FIG. 6B is a perspective view when the light receiving device array according to the second embodiment of the present invention is viewed from the rear surface side.

FIG. 6A is a perspective view when the light-receiving device array 9 according to the second embodiment is viewed from the front surface side. FIG. 6B is a perspective view when the light-receiving device array 9 according to the present embodiment is viewed from the rear surface side. In the carrier 2 according to the first embodiment, the front surface ground electrode 31 is electrically connected to the rear surface ground electrode 34 via the through-hole ground electrode 33. In contrast, in a carrier 10 according to the present embodiment, a front surface ground electrode 37 extends downwardly on the front surface and reaches the front surface lower edge, and a rear surface ground electrode 38 extends downwardly on the rear surface and reaches the rear surface lower edge. In addition, a bottom surface ground electrode (third ground electrode, not shown) is formed on the entire surface of the bottom surface. The bottom surface ground electrode comes into contact with the front surface ground electrode 37 over the front surface lower edge and further comes into contact with the rear surface ground electrode 38 over the rear surface lower edge. Thereby, the front surface ground electrode 37 is electrically connected to the rear surface ground electrode 38 via the bottom surface ground electrode. In addition, although, here, the bottom surface ground electrode is formed on the entire surface of the bottom surface, the present invention is not limited thereto, it may be formed on a part of the bottom surface, or the bottom surface ground electrode may reach the front surface lower edge so as to come into contact with the front surface ground electrode 37 and may reach the rear surface lower edge so as to come into contact with the rear surface ground electrode 38.

The upper surface ground electrode 32 is formed at the inner cutting groove 43 on the upper surface of the carrier 2 according to the first embodiment, and the upper surface ground electrode 32 is electrically insulated from the two upper surface P type electric line electrodes 24a and 24b disposed further outside by the outer cutting grooves 42a and 42b. In contrast, the upper surface ground electrode 32 is formed at a planar portion of the upper surface of the carrier 10 according to the present embodiment, and the upper surface ground electrode 32 is electrically insulated from the two upper surface P type electric line electrodes 24a and 24b disposed further outside by cutting grooves 45a and 45b disposed on both sides of the upper surface ground electrode 32. In relation to a structure of the carrier 10 according to the present embodiment except for the above-described structure, for example, an electrode pattern of a region where the photodiode array is mounted, a disposition of the AuSn solder material, and the like are the same as those in the carrier 2 according to the first embodiment (refer to FIG. 3A).

Figure 7A:
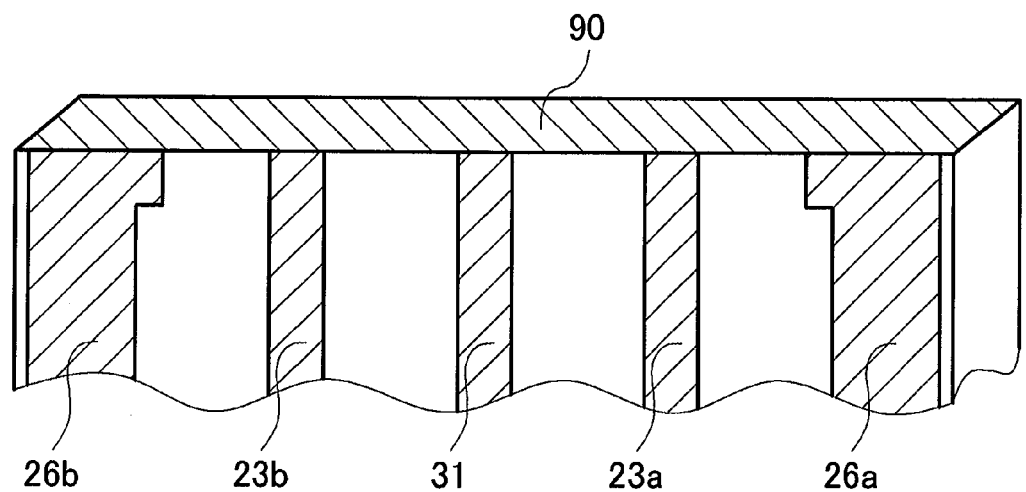
FIG. 7A is a schematic perspective view illustrating a carrier manufacturing process according to the second embodiment of the present invention.
Figure 7B:
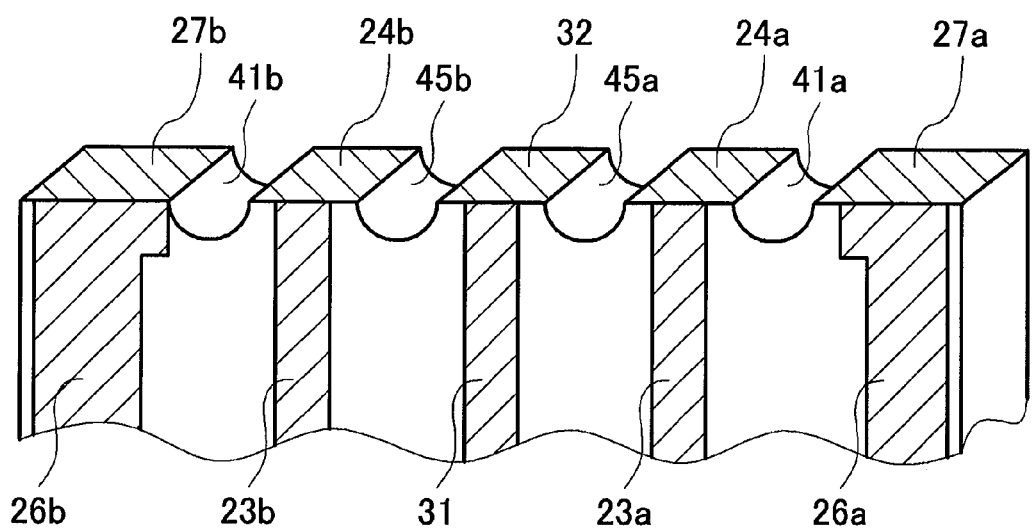
FIG. 7B is a schematic perspective view illustrating the carrier manufacturing process according to the second embodiment of the present invention.

FIGS. 7A and 7B are schematic perspective views illustrating a manufacturing process of the carrier 10 according to the present embodiment. In the same manner as the first embodiment, Ti/Pt/Au films are deposited on the front surface of the aluminum nitride member 21 according to a deposition method, such that the front surface P type electric line electrodes 23a and 23b, the front surface N type electric line electrodes 26a and 26b, the front surface ground electrode 31 are formed in a desired shape. In addition, a conductive film 90 formed from Ti/Pt/Au films is formed on the entire upper surface of the aluminum nitride member 21 (FIG. 7A).

Next, cutting grooves 41a and 41b and outer cutting grooves 45a and 45b are formed through a cutting process (FIG. 7B). By forming the cutting grooves 41a, 45a, 45b and 41b in this order from the right side of FIG. 7B, the conductive film 90 formed on the upper surface becomes the upper surface N type electric line electrode 27a, the upper surface P type electric line electrode 24a, the upper surface ground electrode 32, the upper surface P type electric line electrode 24b, and the upper surface N type electric line electrode 27b in this order from the right side of FIG. 7B. Therefore, the upper surface ground electrode 32 (first ground electrode) is electrically insulated from the upper surface P type electric line electrodes 24a and 24b (P type electric lines 22a and 22b) disposed further outside by the cutting grooves 45a and 45b, and the P type electric line 22 and the N type electric line 25 of each pair of electric lines are electrically insulated from each other by the cutting groove 41.

In a case where a limitation depending on the accuracy of positional deviation in the cutting process has a margin on a portion where a gap between the two upper surface P type electric line electrodes 24a and 24b formed on the upper surface of the carrier 10 is desired to have a predetermined value, a shape of the carrier 10 of the light-receiving device array 9 according to the present embodiment is preferable. In this case, the carrier 10 according to the present embodiment can be formed through the cutting process shown in FIG. 7B, thus an increase in the number of the manufacturing processes is suppressed, and therefore the effects of the present invention are further achieved.

In addition, the upper surface ground electrode 32 may be connected to the ground electric line electrodes of the base via pattern connection wires, and, in this case, it is possible to further increase the electrical crosstalk suppression effect.

In addition, the light-receiving device array 9 according to the present embodiment is provided with the rear surface ground electrode 38 in order to increase the electrical crosstalk reduction effect by the front surface ground electrode 37, but this is not essential. In addition, although, in order to increase the electrical crosstalk reduction effect, the front surface ground electrode 37 and the rear surface ground electrode 38 are electrically connected to each other via both the upper surface ground electrode 32 and the bottom surface ground electrode (not shown), thereby enhancing electrical connection, this is not essential, and either the upper surface ground electrode 32 or the bottom surface ground electrode may be provided.

A shape of the front surface ground electrode 37 is not limited to the shape in the present embodiment, and, as exemplified in FIG. 6A, the front surface ground electrode 37 preferably reaches the vicinity of the N type electric lines 25a and 25b, which can further reduce electric noise.

Third Embodiment

Figure 8:
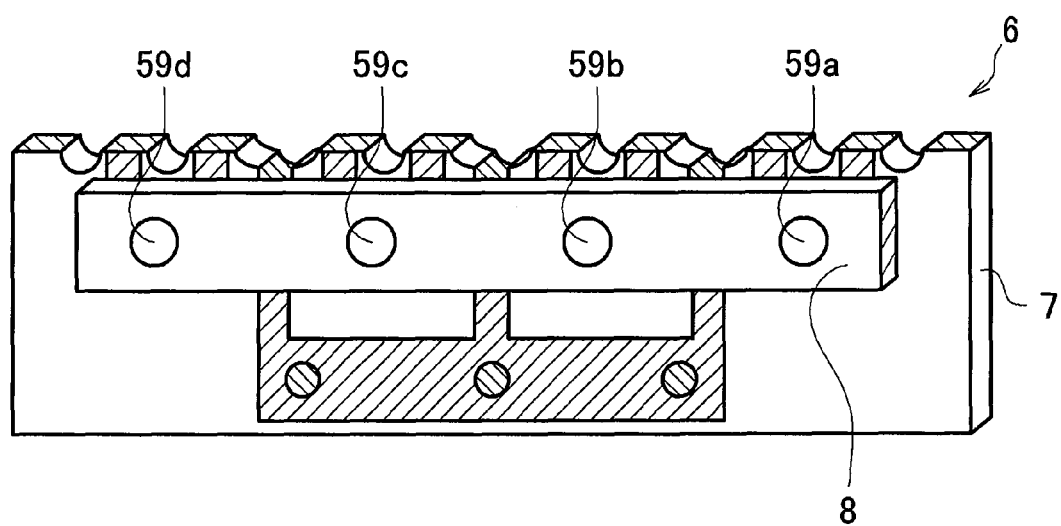
FIG. 8 is a perspective view when a light receiving device array according to a third embodiment of the present invention is viewed from the front surface side.

FIG. 8 is a perspective view when a light-receiving device array 6 according to the third embodiment of the present invention is viewed from the front surface side. The light-receiving device array 6 according to the present embodiment includes a carrier 7, and a photodiode array 8 held in the carrier 7 in the same manner as the light-receiving device array 1 according to the first embodiment. The photodiode array 8 is a four-channel photodiode array where four light-receiving sections are formed on a semiconductor substrate so as to be arranged together. In the same manner as the photodiode array 3 according to the first embodiment, light-receiving windows 59 are provided on the rear surface of the semiconductor substrate of the photodiode array 8. The four light-receiving sections are a first light-receiving section, a second light-receiving section, a third light-receiving section, and a fourth light-receiving section in this order from the right of the figure. The light-receiving windows 59 of the four light-receiving sections are shown as light-receiving windows 59a, 59b, 59c and 59d in this order from the right of the figure. An optical receiver module according to the present embodiment is an optical receiver module including the light-receiving device array 6 according to the present embodiment embedded therein, and an optical transceiver according to the present embodiment is an optical transceiver having the optical receiver module according to the present embodiment.

Figure 9:
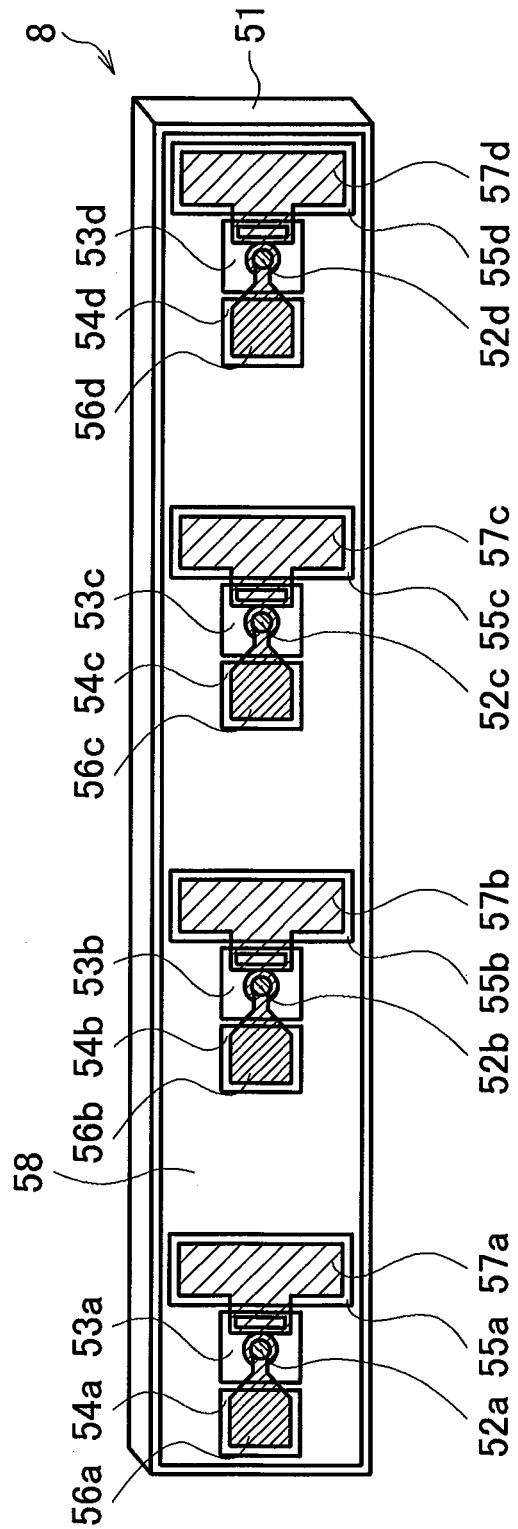
FIG. 9 is a perspective view when a photodiode array according to the third embodiment of the present invention is viewed from the electrode side.

FIG. 9 is a perspective view when the light-receiving device array 8 according to the present embodiment is viewed from the electrode side. The four light-receiving sections are the first light-receiving section, the second light-receiving section, the third light-receiving section, and the fourth light-receiving section in this order from the left of the figure. A structure of each light-receiving section of the photodiode array 8 is basically the same as the structure of the light-receiving section of the photodiode array 3 according to the first embodiment shown in FIG. 2. However, in each light-receiving section of the photodiode array 3 shown in FIG. 2, the P type electrode mesa 14 and the N type electrode mesa 15 are formed at both sides of upper and lower parts the figure of the PN junction, whereas, in each light-receiving section of the photodiode array 8 shown in FIG. 8, the P type electrode mesa 54 and the N type electrode mesa 55 are formed at both sides of left and right parts of the figure. In addition, a P type electrode 56 (the first conductivity type electrode) is formed in the P type electrode mesa 54, and an N type electrode 57 (the second conductivity type electrode) is formed in the N type electrode mesa 55.

As shown in FIG. 9, in the photodiode array 8, the four n type InP contact layers 53a, 53b, 53c and 53d are formed on a semi-insulating Fe-doped InP substrate 51, and the photodetectable mesas 52a, 52b, 52c and 52d are respectively formed thereon. A gap between the adjacent centers of the photodetectable mesas 52a, 52b, 52c and 52d is 0.25 mm. The four light-receiving sections have the same structure, and thus the first light-receiving section will be described as an example. The photodetectable mesa 52a has a multi-layer structure formed from a P type InGaA contact layer, a P type InGaAlAs buffer layer, an N type InGaAs light absorbing layer, and an N type InGaAlAs buffer layer, when viewed from the top side. The photodetectable mesa 52a and the n type InP contact layer 53a forms the PN junction, and can receive light incident from the rear surface of the Fe-doped InP substrate 51 independently from each other. The entire surface of the Fe-doped InP substrate 51 is coated with an insulating protective film 58, but an opening is provided in a circular pattern on the upper surface of the photodetectable mesa 52a, and an opening portion is provided in a rectangular pattern on a part of the n type InP contact layer 53a. The P type electrode mesa 54a and the N type electrode mesa 55a are formed around the photodetectable mesa 52a, and, the height thereof is equal to or larger than the height of the photodetectable mesa 52a. The P type electrode 56a is drawn out to the upper surface of the P type electrode mesa 54a so that the P type electrode 56a is electrically connected via the opening portion to the P type InGaAs contact layer which is the top of the photodetectable mesa 52a. The N type electrode 57a is drawn out to the upper surface of the N type electrode mesa 55a so that the N type electrode 57a is electrically connected via the opening portion to the n type InP contact layer 53a. Structures of the second light-receiving section, the third light-receiving section and the fourth light-receiving section are the same as the structure of the first light-receiving section.

Figure 10A:
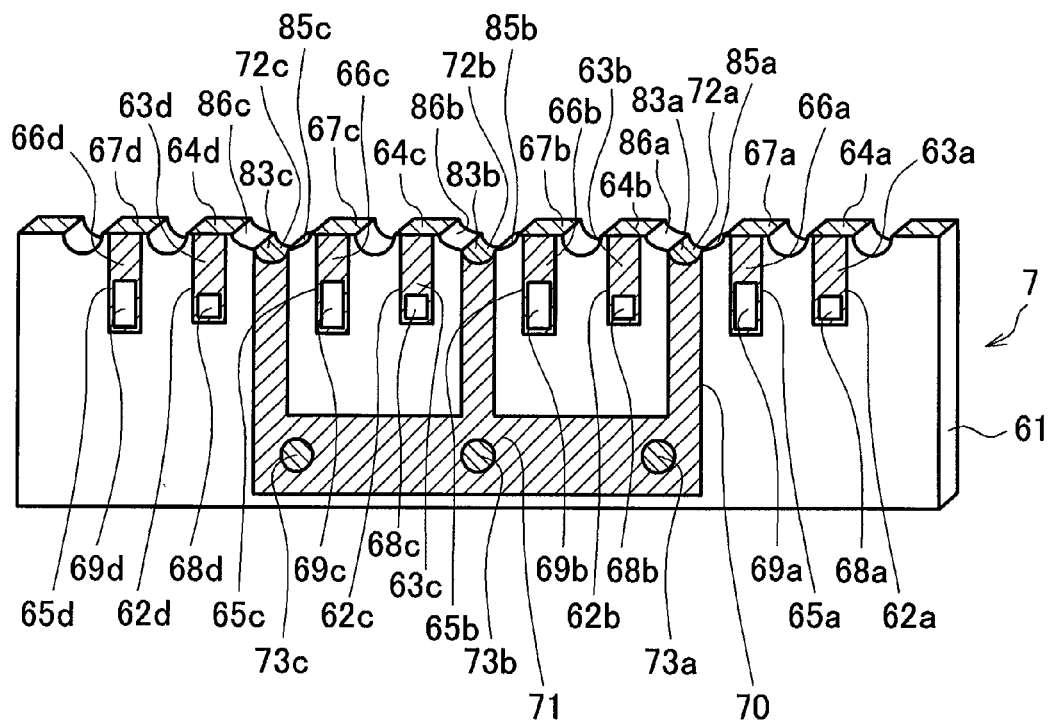
FIG. 10A is a perspective view when a carrier according to the third embodiment of the present invention is viewed from the front surface side.
Figure 10B:
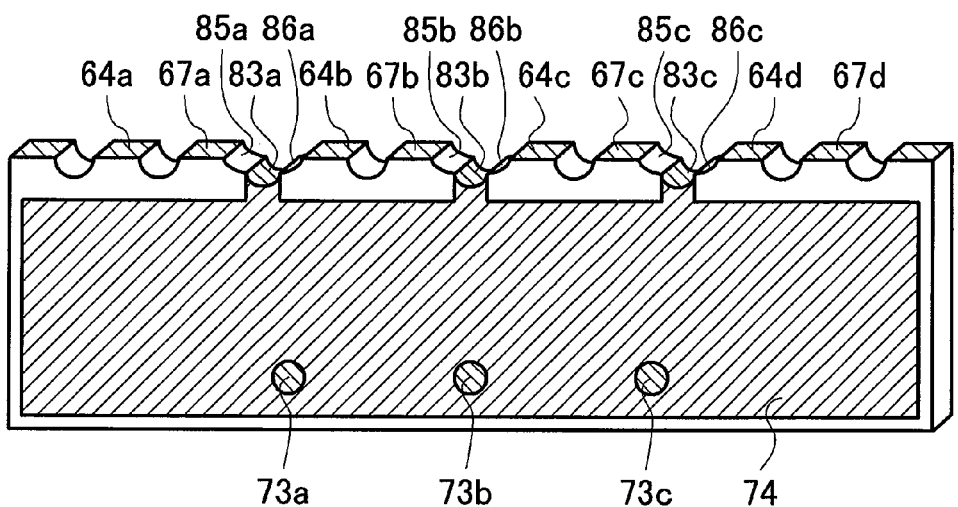
FIG. 10B is a perspective view when the carrier according to the third embodiment of the present invention is viewed from the rear surface side.
Figure 11A:
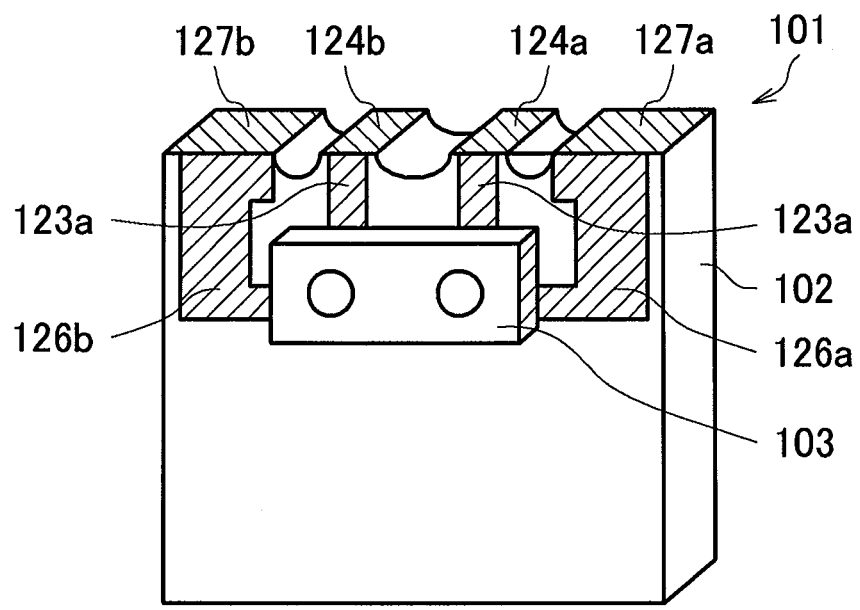
FIG. 11A is a perspective view when a light receiving device array according to the related art is viewed from the front surface side.
Figure 11B:
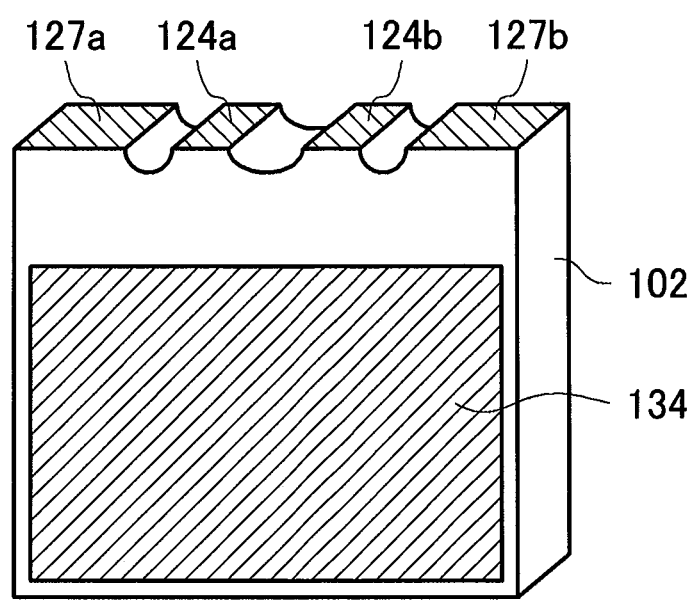
FIG. 11B is a perspective view when the light receiving device array according to the related art is viewed from the rear surface side.

FIG. 10A is a perspective view when the carrier 7 according to the present embodiment is viewed from the front surface side. FIG. 10B is a perspective view when the carrier 7 according to the present embodiment is viewed from the front surface side. The carrier 7 according to the present embodiment, in the same manner as the carrier 2 according to the first embodiment shown in FIGS. 3A and 3B, includes a front surface, a rear surface, an upper surface, a bottom surface, and two lateral surfaces. In the carrier 7, four pairs of electric lines respectively connected to four pairs of electrodes of the photodiode array 8 and a ground electrode 70 are formed an aluminum nitride member 61 of the width 4.1 mm, the height 0.6 mm, and the thickness 0.15 mm.

A first pair of electric lines connected to the first light-receiving section, a second pair of electric lines connected to the second light-receiving section, a third pair of electric lines connected to the third light-receiving section, and a fourth pair of electric lines connected to the fourth light-receiving section are shown in this order from the right side of FIG. 10A. As an example, the first pair of electric lines will be described. The first pair of electric lines is formed from a P type electric line 62a (the first electric line), and an N type electric line 65a (the second electric line). The P type electric line 62a is formed on a part of each of the front surface and the upper surface over the front surface upper edge, and is formed from a front surface P type electric line electrode 63a formed on the front surface and an upper surface P type electric line electrode 64a formed on the upper surface. Similarly, the N type electric line 65a is formed from a front surface N type electric line electrode 66a formed on a part of the front surface and an upper surface N type electric line electrode 67a formed on a part of the upper surface.

At parts of the front surface P type electric line electrode 63a and the front surface N type electric line electrode 66a, AuSn solder materials 68a and 69a are respectively formed. When the photodiode array 8 is mounted on the carrier 7, the P type electrode 56a is electrically connected to the AuSn solder material 68a, and the N type electrode 57a is electrically connected to the AuSn solder material 69a, through soldering connection, and the photodiode array 8 is fixed to the carrier 7 such that the carrier 7 can hold the photodiode array 8.

As shown in FIG. 10A, the front surface P type electric line electrode 63a linearly extends from one end (lower end) where the AuSn solder material 68a is formed toward the front surface upper edge with the same width, and reaches the front surface upper edge. In addition, the front surface N type electric line electrode 66a linearly extends from one end (lower left end) where the AuSn solder material 69a is formed toward the right side of the front surface with the same width so as to be in parallel to the front surface P type electric line electrode 63a, linearly extends towards the upper surface of the front surface, and reaches the front surface upper edge. The front surface N type electric line electrode 66a is formed together with the front surface P type electric line electrode 63a.

In addition, the first pair of electric lines is respectively formed on a part of the upper surface of the carrier 7. As shown in FIG. 10A, the upper surface P type electric line electrode 64a is formed on a part of the upper surface and comes into contact with the front surface P type electric line electrode 63a which reaches the front surface upper edge. Similarly, the upper surface N type electric line electrode 67a is formed on a part of the upper surface and comes into contact with the front surface N type electric line electrode 66a which reaches the front surface upper edge. In addition, the upper surface N type electric line electrode 67a is formed together with the upper surface P type electric line electrode 64a.

In addition, configurations of the second pair of electric lines, the third pair of electric lines, and the fourth pair of electric lines are the same as the configuration of the first pair of electric lines. In each pair of electric lines, the P type electric line 62 located on the right side of FIG. 10A and the N type electric line 65 located on the left side of FIG. 10A are arranged in parallel, and, in four pair of electric lines, as shown in FIG. 10A, the P type electric line 62a, the N type electric line 65a, the P type electric line 62b, the N type electric line 65b, the P type electric line 62c, the N type electric line 65c, the P type electric line 62d, and the N type electric line 65d are arranged in order from the right side of the figure on the front surface of the carrier 7.

The ground electrode 70 is formed from a first ground electrode, a second ground electrode, and a third ground electrode in the same manner as the ground electrode 30 according to the first embodiment. The first ground electrode is formed on a part of each of the front surface and the upper surface over the front surface upper edge, and is formed from the front surface ground electrode 71 formed on the front surface and upper surface ground electrodes 72a, 72b and 72c formed on the upper surface. The second ground electrode is a rear surface ground electrode 74, and the rear surface ground electrode 74 reaches a part of the rear surface upper edge and comes into contact with the upper surface ground electrodes 72a, 72b and 72c over a part of the upper edge. Three through-holes which penetrate through the inside of the region where the front surface ground electrode 71 (the first ground electrode) is formed on the front surface and the inside of the region where the rear surface ground electrode 74 is formed on the rear surface are formed in the carrier 7, and through-hole ground electrodes 73a, 73b and 73c are formed at the lateral surfaces of the through-holes. The third ground electrode is the three through-hole ground electrodes 73a, 73b and 73c, and the through-hole ground electrodes 73a, 73b and 73c come into contact with the front surface ground electrode (the first ground electrode) and the rear surface ground electrode 74 (the second ground electrode) over both ends of the through-holes. Although the three through-hole ground electrodes 73a, 73b and 73c are formed here, the number thereof is not limited to three, and one or plural through-hole ground electrodes may be used. The upper surface ground electrodes 72a, 72b and 72c (the first ground electrode) and the rear surface ground electrode 74 (the second ground electrode) are electrically connected to each other, also by coming into contact with each other over the upper surface of the rear surface. A voltage applied to the first ground electrode is preferably stable and is maintained at a reference voltage, and means for electrically connecting the first ground electrode to the second ground electrode may be selected as necessary. In the carrier 7 according to the present embodiment, both the ends of each of the three through-hole ground electrodes (third ground electrode) respectively come into contact with the first ground electrode and the second ground electrode, and the first ground electrode and the second ground electrode come into contact with each other over three portions of the rear surface upper edge, such that the first ground electrode is stably electrically connected to the second ground electrode.

The front surface ground electrode 71 is formed from a rectangular portion which is provided with one ends (circular shape) on the front surface ground electrode 71 side of the through-hole ground electrodes 73a, 73b and 73c and extends horizontally and three strip-shaped portions which respectively linearly extend toward the upper side with the same width from the rectangular portion and reach the front surface upper edge. The strip-shaped portions of the front surface ground electrode 71 (the first ground electrode) extend to the front surface upper edge between two pairs of electric lines which are arranged together so as to be adjacent to each other. In addition, the upper surface ground electrodes 72a, 72b and 72c formed on the upper surface of the carrier 7 come into contact with the three strip-shaped portions of the front surface ground electrode 71 over the front surface upper edge. In other words, the first ground electrode is disposed between any two pairs of electric lines arranged together so as to be adjacent to each other over the front surface and the upper surface.

Between electric lines of two pairs of electric lines arranged together so as to be adjacent to each other, for example, between the N type electric line 65a and the P type electric line 62b, electrical crosstalk may possibly occur without the strip-shaped portion of the front surface ground electrode 71. However, the first ground electrode is disposed between any two pairs of electric lines arranged together out of plural pairs of electric lines so as to be adjacent to each other over the front surface and the upper surface, and thus the electrical crosstalk is suppressed. In addition, electrical crosstalk which may possibly occur between the two pairs of electric lines of any two light-receiving sections arranged in together so as to be adjacent to each other, for example, between the N type electric line 57a and the P type electric line 56b, is also suppressed by the front surface ground electrode 71. In addition, in the same manner as the carrier 2 according to the first embodiment, dummy electrodes may be provided between the two light-receiving sections arranged together so as to be adjacent to each other in the photodiode array 8, an AuSn solder material may be formed on a part of the corresponding strip-shaped portions of the front surface ground electrode 71 in the carrier 10, and the dummy electrodes may be connected to the AuSn solder material by soldering when the photodiode array 8 is mounted on the carrier 7. In this case, it is possible to further suppress electrical crosstalk which may occur between the corresponding two pairs of electric lines and between the two light-receiving sections.

Here, a gap between the centers adjacent to each other of the upper surface P type electric line electrodes 64a, 64b, 64c and 64d is entirely 0.25 mm. In the same manner as the carrier 2 according to the first embodiment, the upper surface P type electric line electrodes 64a, 64b, 64c and 64d, the upper surface N type electric line electrodes 67a, 67b, 67c and 67d, and the upper surface ground electrodes 72a, 72b and 72c are respectively electrically insulated from each other by plural cutting grooves. The upper surface ground electrodes 72a, 72b and 72c are formed at inner cutting grooves 83a, 83b and 83c, and, for example, the upper surface ground electrode 72a is electrically insulated from the upper surface N type electric line electrode 67a and the upper surface P type electric line electrode 64b disposed further outside by the outer cutting grooves 85a and 86a. In addition, the radius of curvature of the curved surface of the inner cutting groove 83a is smaller than the radius of curvature of the curved surface formed by each of the outer cutting grooves 85a and 86b, and, that is, the curvature of the former is larger than the curvature of the latter. This is also the same for the upper surface ground electrodes 72b and 72c.

A result of performing a characteristic evaluation for the light-receiving device array 6 according to the present embodiment is shown below. Here, in order to evaluate characteristics of the first light-receiving section of the photodiode array 8, the N type electric line 65a is grounded, a reverse bias voltage of 3 V is applied to the P type electric line 62a, and an optical signal of the wavelength 1550 nm and the intensity 10 µW is input to the light-receiving window 59a. As a result, light-receiving sensitivity of 0.7 A/W could be obtained. A dark current at the reverse bias voltage of 3V is 3 nA or less at the room temperature and 30 nA at 85° C., which are sufficiently low values. In a high temperature reverse bias conduction test (200° C. and 6V), a dark current after 2000 hours is 100 nA at 85° C., which indicated high reliability. Capacitance between terminals is 100 fF including parasitic capacitance of the carrier 7, and forward resistance is 20Ω. As a result of measuring frequency response characteristics by applying a reverse bias voltage of 3V and inputting an optical signal of the wavelength 1550 nm and the intensity 100 μW, it is possible to obtain a 3 dB cutoff frequency of 25 GHz or more at 85° C. and an intra-band deviation of 1 dB or less. Similarly, equivalent characteristics could be obtained for the second light-receiving section, the third light-receiving section, and the fourth light-receiving section of the photodiode array 8. Particularly, the light-receiving sensitivity and the inter-channel deviation of the 3 dB cutoff frequency are within 3%.

The first ground electrode and the second ground electrode are stably electrically connected to each other, and thereby electrical crosstalk occurring between the electric lines of two pairs of electric lines arranged together so as to be adjacent to each other is suppressed. If the electrical crosstalk is suppressed, noise generated by the light-receiving device array 6 is suppressed, and thus operation errors of the optical module and the optical transceiver including the light-receiving device array 6 embedded therein are suppressed. The light-receiving device array 6 according to the present embodiment is a four-channel light-receiving device array, and can receive light rays of four wavelengths at the same time, and can be applied for the optical wavelength division multiplex transmission method. For example, the light-receiving device array 6 may be applied as 25-Gigabit and four-channel light-receiving device array which can be applied to a 100-Gigabit Ethernet (registered trademark) transmission system.

In addition, although, in the carrier 7 according to the embodiment, the three strip-shaped portions of the front surface ground electrode 71 (the first ground electrode) are respectively disposed between two pairs of electric lines arranged together so as to be adjacent to each other, the present invention is not limited thereto. Even in a case where the strip-shaped portions are disposed only between predetermined two pairs of electric lines, electrical crosstalk which may occur between the two pairs of electric lines is suppressed. For example, the strip-shaped portion of the front surface ground electrode 71 (the first ground electrode) may be disposed only between the first pair of electric lines (one pair of electric lines) and the second pair of electric lines (a pair of electric lines located around one pair of electric lines).

As above, the light-receiving device array, the optical receiver module, and the optical transceiver according to the present embodiment of the present invention have been described. Here, although the P type electrode is a first conductivity type electrode, the N type electrode is a second conductivity type electrode, the P type electric line is a first electric line, and the N type electric line is a second electric line, the present invention is not limited thereto, the N type may be a first conductivity type and the P type may be a second conductivity type.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A light-receiving device array comprising:
    a photodiode array, being provided with a plurality of light-receiving sections on a semiconductor substrate, each of the light-receiving sections comprising a first conductivity type electrode and a second conductivity type electrode and converting an input optical signal into an electric signal; and
    a carrier, having a front surface on which the photodiode array is disposed so as to be connected thereto, and a rear surface located on an opposite side to the front surface, the carrier comprising:
        a plurality of pair of electric lines, each of the pair of electric lines being formed from a first electric line connected to the first conductivity type electrode of the corresponding light-receiving section and being formed on a part of the front surface, and a second electric line connected to the second conductivity type electrode of the corresponding light-receiving section and being formed on a part of the front surface adjacent to the first electric line;
        a first ground electrode being formed on a part of the front surface and extending between one pair of electric lines of the plurality of pair of electric lines and a pair of electric lines adjacent to the one pair of electric lines; and
        a second ground electrode being formed on at least a part of the rear surface and being electrically connected to the first ground electrode.

2. The light-receiving device array according to claim 1,
    wherein the plurality of pair of electric lines are a first pair of electric lines which is the one pair of electric lines and a second pair of electric lines which is the pair of electric lines adjacent to the one pair of electric lines,
    wherein the plurality of light-receiving sections are a first light-receiving section which is connected to the first pair of electric lines and a second light-receiving section which is connected to the second pair of electric lines, and
    wherein, in the first pair of electric lines and the second pair of electric lines, electric lines disposed inside with respect to the first ground electrode extending therebetween are all the first electric lines.

3. The light-receiving device array according to claim 1,
    wherein the carrier further includes an upper surface located between the front surface upper edge and the rear surface upper edge,
    wherein both the first electric line and the second electric line of each pair of electric lines extend toward the front surface upper edge, and are formed on a part of the upper surface over the upper edge,
    wherein the first ground electrode extends toward the front surface upper edge between the one pair of electric lines and the pair of electric lines adjacent to the one pair of electric lines and is formed on a part of the upper surface over the upper edge.

4. The light-receiving device array according to claim 2,
    wherein the carrier further includes an upper surface located between the front surface upper edge and the rear surface upper edge,
    wherein both the first electric line and the second electric line of each pair of electric lines extend toward the front surface upper edge, and are formed on a part of the upper surface over the upper edge,
    wherein the first ground electrode extends toward the front surface upper edge between the one pair of electric lines and the pair of electric lines adjacent to the one pair of electric lines and is formed on a part of the upper surface over the upper edge.

5. The light-receiving device array according to claim 1, wherein the first ground electrode extends respectively between any two pairs of electric lines arranged so as to be adjacent to each other.

6. The light-receiving device array according to claim 5,
wherein the carrier further includes an upper surface located between the front surface upper edge and the rear surface upper edge,
wherein both the first electric line and the second electric line of each pair of electric lines extend toward the front surface upper edge, and are formed on a part of the upper surface over the upper edge, and
wherein the first ground electrode extends toward the front surface upper edge respectively between any two pairs of electric lines arranged so as to be adjacent to each other, and is formed on a part of the upper surface over the upper edge.

7. The light-receiving device array according to claim 3, wherein a portion where the first electric line of each pair of electric lines is formed on a part of the upper surface and a portion where the second electric line of the pair of electric lines is formed on a part of the upper surface are electrically insulated from each other by a cutting groove.

8. The light-receiving device array according to claim 7,
wherein a portion where the first ground electrode is formed on apart of the upper surface is included in an inner cutting groove, is electrically insulated from electric lines disposed inside with respect to the corresponding portion in the one pair of electric lines and the pair of electric lines adjacent to the one pair of electric lines by outer cutting grooves enlarging to both sides of the inner cutting groove.

9. The light-receiving device array according to claim 7,
wherein a portion where the first ground electrode is formed on a part of the upper surface is electrically insulated from electric lines disposed inside with respect to the corresponding portion in the one pair of electric lines and the pair of electric lines adjacent to the one pair of electric lines by cutting grooves.

10. The light-receiving device array according to claim 6, wherein a portion where the first electric line of each pair of electric lines is formed on a part of the upper surface and a portion where the second electric line of the pair of electric lines is formed on a part of the upper surface are electrically insulated from each other by a cutting groove.

11. The light-receiving device array according to claim 10, wherein each portion where the first ground electrode is formed on a part of the upper surface is included in an inner cutting groove, and is electrically insulated by outer cutting grooves enlarging to both sides of the inner cutting groove, from electric lines disposed inside with respect to the corresponding portion in the corresponding two pairs of electric lines so as to be adjacent to each other and be located further outside to both sides of the inner cutting groove respectively.

12. The light-receiving device array according to claim 10, wherein each portion where the first ground electrode is formed on a part of the upper surface is electrically insulated by cutting grooves from electric lines disposed inside with respect to the corresponding portion in the corresponding two pairs of electric lines so as to be adjacent to each other and be located at both sides of the corresponding portion.

13. The light-receiving device array according to claim 1, wherein each of the light-receiving sections further includes a PN junction that receives light incident to a rear surface of the semiconductor substrate,
wherein the first conductivity type electrode is electrically connected to one side of the PN junction, and
wherein the second conductivity type electrode is electrically connected to the other side of the PN junction.

14. The light-receiving device array according to claim 1,
wherein the carrier further includes one or a plurality of through-holes that penetrate through an inside of a region where the first ground electrode is formed on the front surface and an inside of a region where the second ground electrode is formed on the rear surface, and
wherein the light-receiving device array further comprises one or a plurality of third ground electrodes that are respectively formed at lateral surfaces of the one or the plurality of through-holes and come into contact with the first ground electrode and the second ground electrode.

15. The light-receiving device array according to claim 1,
wherein the carrier further includes a bottom surface located between the front surface lower edge and the rear surface lower edge, and
wherein the light-receiving device array further includes a third ground electrode that comes into contact with the first ground electrode over the front surface lower edge, comes into contact with the second ground electrode over the rear surface lower edge, and is formed on a part of the bottom surface.

16. The light-receiving device array according to claim 6, wherein a portion where the first ground electrode is formed on a part of the upper surface extends toward the rear surface upper edge, and comes into contact with the second ground electrode over the rear surface upper edge.

17. An optical receiver module comprising the light-receiving device array according to claim 1.

18. An optical transceiver comprising the optical receiver module according to claim 17.

* * * * *